United States Patent
Klaren et al.

(10) Patent No.: US 10,756,678 B2
(45) Date of Patent: Aug. 25, 2020

(54) CASCODE AMPLIFIER BIAS CIRCUITS

(71) Applicant: pSemi Corporation, San Diego, CA (US)

(72) Inventors: Jonathan James Klaren, San Diego, CA (US); David Kovac, Arlington Heights, IL (US); Eric S. Shapiro, San Diego, CA (US); Christopher C. Murphy, Lake Zurich, IL (US); Robert Mark Englekirk, Littleton, CO (US); Keith Bargroff, San Diego, CA (US); Tero Tapio Ranta, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/250,889

(22) Filed: Jan. 17, 2019

(65) Prior Publication Data

US 2019/0158031 A1    May 23, 2019

Related U.S. Application Data

(62) Division of application No. 15/268,229, filed on Sep. 16, 2016, now Pat. No. 10,250,199.

(51) Int. Cl.
*H03F 1/22* (2006.01)
*H03F 3/195* (2006.01)
(Continued)

(52) U.S. Cl.
CPC ............ *H03F 1/223* (2013.01); *H03F 1/301* (2013.01); *H03F 1/56* (2013.01); *H03F 3/193* (2013.01);
(Continued)

(58) Field of Classification Search
CPC ..................................................... H03F 1/223
See application file for complete search history.

(56) References Cited

U.S. PATENT DOCUMENTS 4,749,889 A    6/1988   Lagoni et al.
5,986,507 A *  11/1999  Itakura .................... H03F 3/345
                                                        330/288
(Continued)

FOREIGN PATENT DOCUMENTS

EP          1615337       1/2006
WO         2018052460     3/2018
(Continued)

OTHER PUBLICATIONS

Mottola, Steven J., Office Action received from the USPTO dated Dec. 5, 2019 for U.S. Appl. No. 16/453,287, 22 pgs.
(Continued)

*Primary Examiner* — Patricia T Nguyen
(74) *Attorney, Agent, or Firm* — Jaquez Land Greenhaus LLP; John Land, Esq.

(57) ABSTRACT

Bias circuits and methods for silicon-based amplifier architectures that are tolerant of supply and bias voltage variations, bias current variations, and transistor stack height, and compensate for poor output resistance characteristics. Embodiments include power amplifiers and low-noise amplifiers that utilize a cascode reference circuit to bias the final stages of a cascode amplifier under the control of a closed loop bias control circuit. The closed loop bias control circuit ensures that the current in the cascode reference circuit is approximately equal to a selected multiple of a known current value by adjusting the gate bias voltage to the final stage of the cascode amplifier. The final current through the cascode amplifier is a multiple of the current in the cascode reference circuit, based on a device scaling factor
(Continued)

representing the relative sizes of the transistor devices in the cascode amplifier and in the cascode reference circuit.

20 Claims, 11 Drawing Sheets

(51) Int. Cl.
    *H03F 3/213*     (2006.01)
    *H03F 3/24*     (2006.01)
    *H03F 1/30*     (2006.01)
    *H03F 1/56*     (2006.01)
    *H03F 3/193*     (2006.01)

(52) U.S. Cl.
    CPC ............ *H03F 3/195* (2013.01); *H03F 3/213* (2013.01); *H03F 3/245* (2013.01); *H03F 2200/102* (2013.01); *H03F 2200/105* (2013.01); *H03F 2200/165* (2013.01); *H03F 2200/18* (2013.01); *H03F 2200/21* (2013.01); *H03F 2200/222* (2013.01); *H03F 2200/225* (2013.01); *H03F 2200/243* (2013.01); *H03F 2200/294* (2013.01); *H03F 2200/297* (2013.01); *H03F 2200/301* (2013.01); *H03F 2200/306* (2013.01); *H03F 2200/387* (2013.01); *H03F 2200/391* (2013.01); *H03F 2200/399* (2013.01); *H03F 2200/42* (2013.01); *H03F 2200/451* (2013.01); *H03F 2200/48* (2013.01); *H03F 2200/489* (2013.01); *H03F 2200/492* (2013.01); *H03F 2200/498* (2013.01); *H03F 2200/555* (2013.01); *H03F 2200/61* (2013.01); *H03F 2200/78* (2013.01)

(56) References Cited

U.S. PATENT DOCUMENTS

| | | |
|---|---|---|
| 6,392,490 B1 | 5/2002 | Gramegna et al. |
| 6,731,171 B2 | 5/2004 | Yamashita |
| 6,747,514 B1 | 6/2004 | Aude |
| 6,831,504 B1 | 12/2004 | Holloway et al. |
| 7,248,120 B2 | 7/2007 | Burgener et al. |
| 7,276,976 B2 | 10/2007 | Oh et al. |
| 7,382,305 B1 * | 6/2008 | Murden ............... G05F 1/575 327/539 |
| 7,649,418 B2 | 1/2010 | Matsui |
| 7,656,233 B2 | 2/2010 | Lee |
| 7,737,790 B1 | 6/2010 | Chen et al. |
| 7,859,243 B2 | 12/2010 | Lorenz |
| 8,022,755 B2 | 9/2011 | Gomez et al. |
| 8,111,104 B2 | 2/2012 | Ahadian et al. |
| 8,441,320 B2 | 5/2013 | Signoff et al. |
| 8,446,173 B1 | 5/2013 | Faucher et al. |
| 8,487,706 B2 | 7/2013 | Li et al. |
| 8,779,859 B2 | 7/2014 | Su et al. |
| 8,779,860 B2 | 7/2014 | Jeon |
| 8,928,415 B2 | 1/2015 | Cha et al. |
| 9,083,287 B2 | 7/2015 | Papamichail |
| 9,148,088 B1 | 9/2015 | Ding |
| 9,219,445 B2 | 12/2015 | Nobbe et al. |
| 9,231,528 B2 | 1/2016 | Granger-Jones et al. |
| 9,413,298 B2 | 8/2016 | Nobbe et al. |
| 9,509,263 B2 | 11/2016 | Lam |
| 9,641,141 B1 | 5/2017 | Zheng et al. |
| 9,837,965 B1 | 12/2017 | Wagh et al. |
| 9,843,293 B1 | 12/2017 | Wagh et al. |
| 9,874,893 B2 | 1/2018 | Ciubotaru |
| 9,882,531 B1 | 1/2018 | Willard et al. |
| 10,056,874 B1 | 8/2018 | Ranta et al. |
| 10,181,819 B2 | 1/2019 | Wagh et al. |
| 10,250,199 B2 | 4/2019 | Klaren et al. |
| 10,367,453 B2 | 7/2019 | Willard et al. |
| 10,389,306 B2 | 8/2019 | Wagh et al. |
| 10,700,642 B2 | 6/2020 | Wagh et al. |
| 2002/0158682 A1 * | 10/2002 | Conte ............... G05F 3/30 327/539 |
| 2004/0135639 A1 | 7/2004 | Maneatis |
| 2004/0245975 A1 | 12/2004 | Tran et al. |
| 2005/0029453 A1 | 2/2005 | Allen et al. |
| 2005/0206454 A1 | 9/2005 | Richard |
| 2006/0226910 A1 | 10/2006 | Tanoi |
| 2007/0075784 A1 | 4/2007 | Pettersson et al. |
| 2009/0302824 A1 * | 12/2009 | Kim ............... G05F 3/24 323/313 |
| 2010/0244964 A1 | 9/2010 | Deguchi et al. |
| 2010/0329013 A1 | 12/2010 | Shikata et al. |
| 2011/0025422 A1 | 2/2011 | Marra et al. |
| 2011/0043284 A1 | 2/2011 | Zhao et al. |
| 2011/0181364 A1 | 7/2011 | Ahadian et al. |
| 2011/0298538 A1 | 12/2011 | Andrys et al. |
| 2011/0304393 A1 | 12/2011 | Luff |
| 2012/0139643 A1 | 6/2012 | Scott et al. |
| 2012/0200338 A1 | 8/2012 | Olson |
| 2013/0082782 A1 | 4/2013 | Leuschner et al. |
| 2013/0187712 A1 | 7/2013 | Cabanillas et al. |
| 2013/0229231 A1 | 9/2013 | Tanaka et al. |
| 2013/0310114 A1 | 11/2013 | Zohny et al. |
| 2014/0171010 A1 | 6/2014 | Olson |
| 2014/0184335 A1 | 7/2014 | Nobbe et al. |
| 2014/0266458 A1 | 9/2014 | Scott et al. |
| 2014/0266460 A1 | 9/2014 | Nobbe et al. |
| 2015/0084695 A1 | 3/2015 | Onizuka |
| 2015/0236650 A1 | 8/2015 | Deo |
| 2015/0270806 A1 | 9/2015 | Wagh et al. |
| 2015/0280655 A1 | 10/2015 | Nobbe et al. |
| 2015/0280672 A1 * | 10/2015 | Ding ............... H03F 3/19 375/345 |
| 2016/0126906 A1 | 5/2016 | Maxim et al. |
| 2016/0241235 A1 | 8/2016 | Hasegawa |
| 2017/0133989 A1 | 5/2017 | Dykstra et al. |
| 2017/0146591 A1 | 5/2017 | Nobbe et al. |
| 2017/0149437 A1 | 5/2017 | Luo et al. |
| 2018/0083577 A1 | 3/2018 | Wagh et al. |
| 2018/0083578 A1 | 3/2018 | Klaren et al. |
| 2018/0159475 A1 | 6/2018 | Willard et al. |
| 2018/0262163 A1 | 9/2018 | Tokuda et al. |
| 2018/0262164 A1 | 9/2018 | Ranta et al. |
| 2018/0262166 A1 | 9/2018 | Takagi et al. |
| 2019/0158029 A1 | 5/2019 | Wagh et al. |
| 2019/0190459 A1 | 6/2019 | Wagh et al. |
| 2019/0379330 A1 | 12/2019 | Willard et al. |
| 2020/0036340 A1 * | 1/2020 | Yoshimasu ............... G05F 1/565 |
| 2020/0076391 A1 | 3/2020 | Ranta et al. |

FOREIGN PATENT DOCUMENTS

| | | |
|---|---|---|
| WO | 2018052539 | 3/2018 |
| WO | 2018052817 | 3/2018 |

OTHER PUBLICATIONS

Choe, Henry, Notice of Allowance received from the USPTO dated Feb. 14, 2020 for U.S. Appl. No. 16/240,601, 10 pgs.

Nguyen, Hieu P., Office Action received from the USPTO dated Mar. 9, 2020 for U.S. Appl. No. 16/253,115, 28 pgs.

Nguyen, Patricia T., Notice of Allowance received from the USPTO dated Jul. 15, 2019 for U.S. Appl. No. 16/283,298, 8 pgs.

Nguyen, Patricia T., Office Action received from the USPTO dated Dec. 11, 2017 for U.S. Appl. No. 15/268,229, 6 pgs.

Nguyen, Patricia T., Office Action received from the USPTO dated May 3, 2018 for U.S. Appl. No. 15/268,229, 34 pgs.

Nguyen, Patricia T., Notice of Allowance received from the USPTO dated Nov. 30, 2018 for U.S. Appl. No. 15/268,229, 33 pgs.

Klaren, et al., Preliminary Amendment filed in the USPTO dated Nov. 29, 2016 for U.S. Appl. No. 15/268,229, 11 pgs.

Klaren, et al., Response filed in the USPTO dated Jan. 29, 2018 for U.S. Appl. No. 15/268,229, 7 pgs.

Klaren, et al., Response filed in the USPTO dated Jul. 17, 2018 for U.S. Appl. No. 15/268,229, 10 pgs.

(56) References Cited

OTHER PUBLICATIONS

Wagh, et al., "Standby Voltage Condition for Fast RF Amplifier Bias Recovery", patent application filed on Sep. 16, 2016, U.S. Appl. No. 15/268,297, 53 pgs.
Wagh, et al., "Gate Drivers for Stacked Transistor Amplifiers", patent application filed on Sep. 16, 2016, U.S. Appl. No. 15/268,275, 57 pgs.
Willard, et al., "Body Tie Optimization for Stacked Transistor Amplifier", patent application filed on Sep. 16, 2016, U.S. Appl. No. 15/268,257, 42 pgs.
Willard, et al., Response filed in the USPTO dated Sep. 20, 2017 for U.S. Appl. No. 15/268,257, 14 pgs.
Mottola, Steven J., Office Action received from the USPTO dated Jul. 11, 2017 for U.S. Appl. No. 15/268,257, 22 pgs.
Nguyen, Patricia T., Notice of Allowance received from the USPTO dated Sep. 22, 2017 for U.S. Appl. No. 15/268,297, 13 pgs.
Nguyen, Patricia T., Office Action received from the USPTO dated Mar. 9, 2017 for U.S. Appl. No. 15/268,297, 7 pgs.
Nguyen, Patricia T., Notice of Allowance received from the USPTO dated Jun. 26, 2017 for U.S. Appl. No. 15/268,297, 13 pgs.
Choe, Henry, Notice of Allowance received from the USPTO dated Oct. 24, 2017 for U.S. Appl. No. 15/268,275, 14 pgs.
Choe, Henry, Office Action received from the USPTO date Jun. 1, 2017 for U.S. Appl. No. 15/268,275, 4 pgs.
Choe, Henry, Notice of Allowance received from the USPTO dated Jul. 24, 2017 for U.S. Appl. No. 15/268,275, 25 pgs.
Mottola, Steven J., Notice of Allowance received from the USPTO dated Nov. 24, 2017 for U.S. Appl. No. 15/268,257, 18 pgs.
Nguyen, Hieu P., Office Action received from the USPTO dated Jan. 30, 2018 for U.S. Appl. No. 15/445,811, 6 pgs.
Nguyen, Patricia T., Office Action received from the USPTO dated May 18, 2018 for U.S. Appl. No. 15/785,096, 13 pgs.
Nguyen, Hieu P., Notice of Allowance received from the USPTO dated May 23, 2018 for U.S. Appl. No. 15/445,811, 22 pgs.
Choe, Henry, Office Action received from the USPTO dated Apr. 12, 2018 for U.S. Appl. No. 15/690,115, 18 pgs.
Gundlach, Susanne, Invitation to Pay Additional Fees and, Where Applicable, Protest Fee received from the EPO dated Jun. 15, 2018 for appln. No. PCT/US2018/020332, 13 pgs.
Wienema, David, Written Opinion received from the EPO dated Aug. 6, 2018 for appln. No. PCT/US2017/044015, 14 pgs.
Wienema, David, Written Opinion received from the EPO dated Aug. 9, 2018 for appln. No. PCT/US2017/057052, 8 pgs.
Pornpromlikit, et al., "A Watt-Level Stacked-FET Linear Power Amplifier in Silicon-on-Insulator CMOS", IEEE Transactions on Microwave Theory and Techniques, vol. 58, No. 1, Jan. 2010, pp. 57-64, 8 pgs.
Kurzbauer, Werner, Written Opinion received from the EPO dated Aug. 15, 2018 for appln. No. PCT/US2017/050839, 8 pgs.
Nguyen, Patricia T., Notice of Allowance received from the USPTO dated Sep. 12, 2018 for U.S. Appl. No. 15/785,096, 12 pgs.
Nguyen, Hieu P., Office Action received from the USPTO dated Sep. 14, 2018 for U.S. Appl. No. 15/908,354, 19 pgs.
Nguyen, Hieu P., Office Action received from the USPTO dated Sep. 14, 2018 for U.S. Appl. No. 15/908,469, 18 pgs.
Nguyen, Hieu P., Office Action received from the USPTO dated Oct. 12, 2018 for U.S. Appl. No. 15/908,533, 6 pgs.
Nguyen, Hieu P., Office Action received from the USPTO dated Nov. 9, 2018 for U.S. Appl. No. 16/025,873, 5 pgs.
Mottola, Steven J., Office Action received from the USPTO dated Dec. 3, 2018 for U.S. Appl. No. 15/839,648, 22 pgs.
Choe, Henry, Notice of Allowance received from the USPTO dated Dec. 18, 2018 for U.S. Appl. No. 15/690,115, 31 pgs.
Nguyen, Hieu P., Office Action received from the USPTO dated Jan. 7, 2019 for U.S. Appl. No. 15/908,533, 27 pgs.
Nguyen, Hieu P., Final Office Action received from the USPTO dated Jan. 14, 2019 for U.S. Appl. No. 15/908,469, 17 pgs.
Camps, Ester, Communication received from the EPO dated Nov. 14, 2018 for appln. No. PCT/US2017/050839, 3 pgs.
Wienema, David, Written Opinion received from the EPO dated Nov. 27, 2018 for appln. No. PCT/US2016/057052, 9 pgs.
Wienema, David, International Preliminary Report on Patentability received from the EPO dated Dec. 12, 2018 for appln. No. PCT/US2017/044015, 39 pgs.
Wienema, David, International Preliminary Report on Patentability received from the EPO dated Jan. 4, 2019 for appln. no. PCT/US2016/057052, 39 pgs.
Duperron, Nathalie, International Search Report and Written Opinion received from the EPO dated Aug. 31, 2017 for appln. No. PCT/US2017/044015, 19 pgs.
Kellner, Alexandra, International Search Report received from the EPO dated Dec. 8, 2017 for appln. No. PCT.US2017/050839, 13 pgs.
Kurzbauer, Werner, International Preliminary Report on Patentability received from the EPO dated Jan. 30, 2019 for appln. No. PCT.US2017/050839, 7 pgs.
Arias-Kraska, Agnieszka, International Preliminary Report on Patentability received from the EPO dated May 10, 2017 for appln. No. PCT/US2016/057052, 15 pgs.
Mottola, Steven J., Notice of Allowance received from the USPTO dated Mar. 13, 2019 for U.S. Appl. No. 15/839,648, 13 pgs.
Choe, Henry, Office Action received from the USPTO dated Sep. 20, 2019 for U.S. Appl. No. 16/240,601, 27 pgs.
Mottola, Steven J., Notice of Allowance received from the USPTO dated May 20, 2020 for U.S. Appl. No. 16/453,287, 9 pgs.
Mottola, Steven J., Notice of Allowance received from the USPTO dated Mar. 19, 2020 for U.S. Appl. No. 16/453,287, 9 pgs.
Nguyen, Hieu P., Notice of Allowance received from the USPTO dated Mar. 25, 2020 for U.S. Appl. No. 16/676,219, 22 pgs.

* cited by examiner

CASCODE AMPLIFIER BIAS CIRCUITS

CROSS-REFERENCE TO RELATED APPLICATIONS—CLAIM OF PRIORITY

The present application is a divisional of, and claims priority to, co-pending and commonly assigned U.S. patent application Ser. No. 15/268,229, filed Sep. 16, 2016, entitled "Cascode Amplifier Bias Circuits", and the contents of said Ser. No. 15/268,229 application is incorporated herein by reference in its entirety.

The present application is related to U.S. application Ser. No. 15/268,297 entitled "Standby Voltage Condition for Fast RF Amplifier Bias Recovery" filed on Sep. 16, 2016 (now U.S. Pat. No. 9,837,965 issued Dec. 5, 2017), the disclosure of which is incorporated herein by reference in its entirety. The present application is also related to U.S. application Ser. No. 15/268,275 entitled "Gate Drivers for Stacked Transistor Amplifiers" filed on Sep. 16, 2016 (now U.S. Pat. No. 9,843,293 issued Dec. 12, 2017), the disclosure of which is incorporated herein by reference in its entirety. The present application is also related to U.S. application Ser. No. 15/268,257 entitled "Body Tie Optimization for Stacked Transistor Amplifier" filed on Sep. 16, 2016 (now U.S. Pat. No. 9,882,531 issued Jan. 30, 2018), the disclosure of which is incorporated herein by reference in its entirety.

The present application may be related to U.S. Pat. No. 7,248,120, issued on Jul. 24, 2007, entitled "Stacked Transistor Method and Apparatus", the disclosure of which is incorporated herein by reference in its entirety. The present application may be related to Published US Application No. 2015/0270806 A1, published Sep. 24, 2015, entitled "Bias Control for Stacked Transistor Configuration", the disclosure of which is incorporated herein by reference in its entirety. The present application may also be related to Published US Application No. 2014/0184335 A1, published Jul. 3, 2014, entitled "Amplifiers Operating in Envelope Tracking Mode or Non-Envelope Tracking Mode", the disclosure of which is incorporated herein by reference in its entirety. The present application may also be related to Published US Application No. US 2014/0184336 A1, published Jul. 3, 2014, entitled "Amplifier Dynamic Bias Adjustment for Envelope Tracking", the disclosure of which is incorporated herein in its entirety. The present application may also be related to U.S. Pat. No. 9,219,445 entitled "Optimization Methods for Amplifier with Variable Supply Power", issued Dec. 22, 2015, the disclosure of which is incorporated herein by reference in its entirety. The present application may also be related to U.S. Pat. No. 8,487,706 B2 entitled "Stacked Linear Power Amplifier with Capacitor Feedback and Resistor Isolation", issued Jul. 16, 2013, the disclosure of which is incorporated herein by reference in its entirety.

BACKGROUND

(1) Technical Field

The invention relates to electronic circuits, and more particularly to bias circuits for cascode amplifiers, particularly radio frequency cascode amplifiers.

(2) Background

Amplifiers are a common component in radio frequency (RF) transmitters and receivers, and are frequently used for power amplification of transmitted RF signals and for low-noise amplification of received RF signals. For many RF systems, particularly those requiring portability (e.g., cellular telephones, WiFi-connected computers, cameras, and other devices, etc.), it has become common to use complementary metal-oxide semiconductor (CMOS) fabrication technology to create low cost, low power, complex integrated circuits (ICs). CMOS device technology improvements, such as silicon-on-sapphire (SOS) CMOS, silicon-on-insulator (SOI) CMOS, and ever-shrinking field-effect transistor (FET) device channel lengths, are putting the RF performance metrics of silicon-based CMOS transistors on par with rival gallium arsenide (GaAs) technologies.

FIG. 1 is a simplified schematic diagram of a prior art amplifier circuit 100. The illustrated circuit 100 has a cascode common source architecture constructed from two series-connected FETs. An RF input signal, RFIN, is applied through a biasing and coupling circuit 102 to the gate of a FET M1, the drain of which is coupled to (and thus drives) the source of a second FET M2. The source of M1 is coupled thorough a degeneration inductor L to RF ground. The degeneration inductor L, which will also have an inherent resistance R (shown in dotted outline), performs several functions, including obtaining a good dynamic range (e.g., a good noise figure), achieving high sensitivity with low power consumption, helping make input impedance matching easier, and improving linearity.

The second FET M2 has its gate coupled to a voltage source Vgate (which may be $V_{DD}$ in many cases) and provides an amplified RF output signal, RFOUT, at its drain. In some applications, the RF input signal, RFIN, may be processed through an input impedance matching network 104 before being coupled to the gate of M1, and in some applications, the RF output signal, RFOUT, may be processed through an output impedance matching network 106. While the illustrated cascode circuit provides good isolation because there is no direct coupling from the output to the input, the circuit is not well suited to applications in which the DC supply voltage varies, such as applications where the DC supply voltage at the drain is actively modified to optimize operation at different power levels; examples are average power tracking (APT), envelope tracking (ET), and GSM power amplifier power control. In these examples, the supply voltage $V_{DD}$ may have a range that varies by a factor of 10 or more (e.g., from 4.5V to 0.4V, as one example).

One problem area for using silicon-based CMOS transistors in cascode amplifier circuits is creating bias circuits, particularly in cases in which the DC supply voltage varies and in the case of amplifiers with a transistor stack height of 3 or more. In general, a DC bias voltage applied to the gate of a FET sets the gate-source voltage $V_{GS}$ so as to provide a desired drain current. Silicon-based CMOS devices with short channel lengths provide fast RF response—a desirable characteristic in an amplifier—but suffer from poor output resistance characteristics due to the influence of the drain voltage on the gate of a transistor device. As such, they are not amenable to common open-loop bias techniques, such as current mirrors, without suffering from a large and undesirable mismatch between a reference device current and the output device current. In addition, the problem can be further exasperated in SOS and SOI CMOS technologies due to issues associated with the floating body or "kink" effect. In the floating body effect, the body of a transistor may form a capacitor with the insulated substrate; charge accumulation on this capacitor may cause the formation of parasitic transistors consuming unwanted parasitic currents and further degrading the output resistance of devices intended to be used as current sources.

Another challenge in designing bias circuits for silicon-based CMOS cascode amplifiers is to configure such circuits so that they are tolerant of supply and bias voltage variations, and bias current variations. Traditional cascode bias circuits include diode connected devices which do not accommodate a wide range of supply and bias voltages. Bias current variations may be driven by variations in process, temperature, and voltage (i.e., "PVT" effects), the end result of which is to cause fluctuations in bias current leading to fluctuations in RF performance. Another drawback to using silicon-based CMOS devices for amplifier applications, and particularly for power amplifier applications, is a relatively low breakdown voltage per device.

Yet another challenge in designing RF amplifiers is that, in many applications, the RF electrical environment of a transmitter, receiver, or transceiver is constantly changing. The changing characteristics of an RF signal path affects RF circuit performance metrics such as gain, linearity, noise figure, and power consumption. A system performance profile that ideally sets such metrics for one situation (such as high gain, moderate linearity, and low noise in the presence of a small received signal) can be completely inappropriate as the RF environment changes (such as with increasing received signal power). These situation transitions can occur many times during a single usage session of an RF circuit (for example, as a cellular phone moves relative to signal towers), and not adjusting to an appropriate performance profile as the RF environment changes can result in poor or non-functioning RF circuit performance.

Accordingly, there is a need for bias circuits for silicon-based CMOS amplifier architectures that are tolerant of supply and bias voltage variations, bias current variations, and transistor stack height, and compensate for the poor output resistance characteristics of silicon-based CMOS devices with short channel lengths. There is also a need for amplifier architectures that can rapidly adapt to a changing RF electrical environment. Further, there is a need for improved silicon-based CMOS amplifier architectures having good isolation.

SUMMARY OF THE INVENTION

The invention encompasses bias circuits and methods for silicon-based CMOS amplifier architectures that are tolerant of supply and bias voltage variations, bias current variations, and transistor stack height, and compensate for the poor output resistance characteristics of silicon-based CMOS devices with short channel lengths. Further, the invention encompasses improved silicon-based CMOS amplifier architectures that can rapidly adapt to a changing RF electrical environment, and which have good isolation. The disclosed amplifier architectures are adaptable to a number of amplifier applications, including power amplifiers (PAs) and low-noise amplifiers (LNAs).

Embodiments of the invention utilize a cascode reference circuit to bias the final stages of a cascode amplifier under the control of a closed loop bias control circuit. The closed loop bias control circuit ensures that the current in the cascode reference circuit is approximately equal to a selected multiple of a known current value by adjusting the gate bias voltage to the final stage of the cascode amplifier. The final current through the cascode amplifier is a multiple of the current in the cascode reference circuit, based on a device scaling factor m representing the size of the transistor devices in the cascode amplifier versus the size of the transistor devices in the cascode reference circuit. A notable attribute of such an architecture is that the cascode reference circuit accommodates arbitrary variations in its supply voltage.

In some embodiments, the closed loop bias control circuit is digitally programmable such that the biased current through the cascode amplifier can be dynamically adjusted during operation. In some embodiments, in order to overcome the breakdown voltage liability of individual silicon-based CMOS devices, the cascode amplifier and/or the cascode reference circuit include a "stack" of two or more series-connected silicon-based CMOS devices so that the total RF voltage swing occurring across the stack is distributed over two or more CMOS devices; the stack height of the cascode amplifier and the cascode reference circuit need not be the same.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Figure 1:
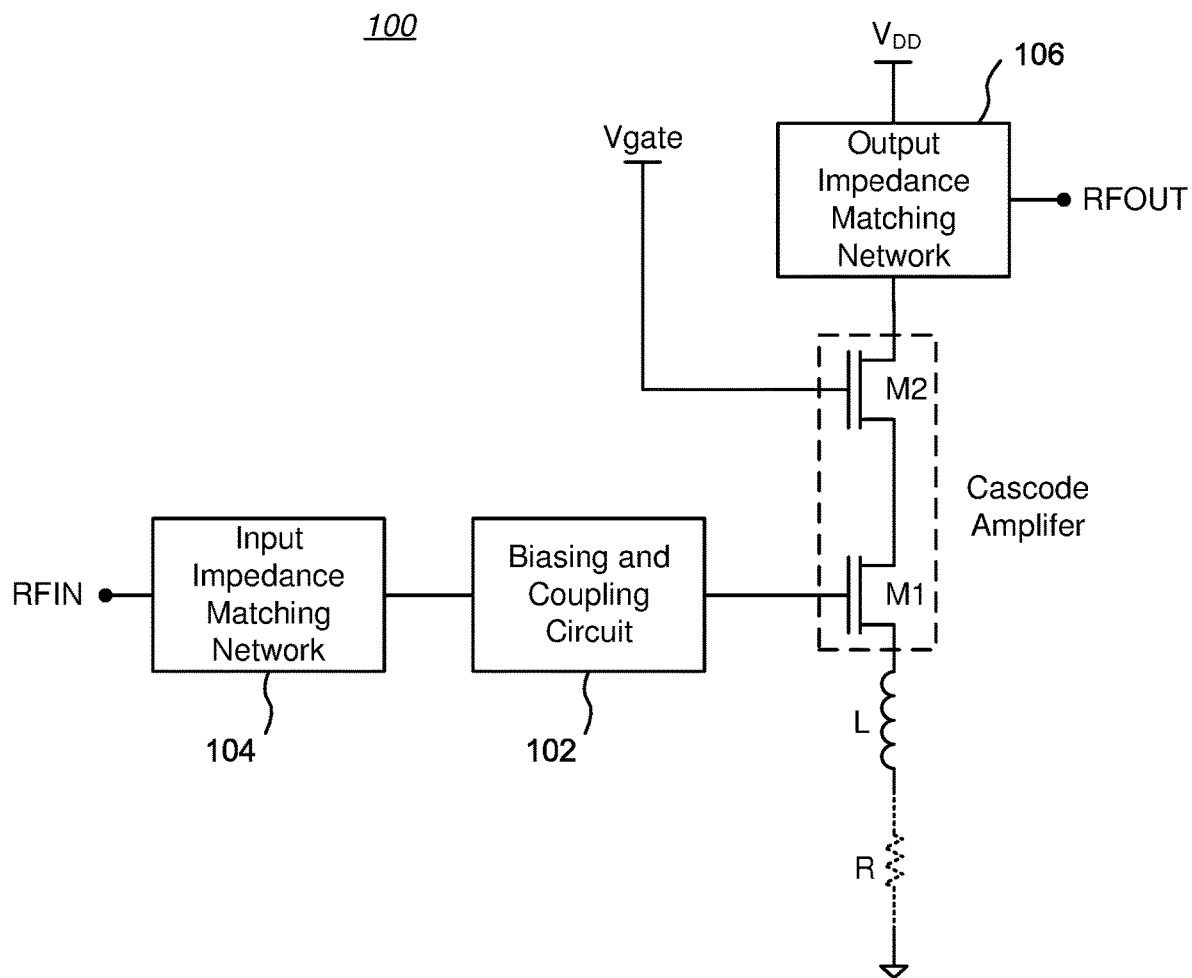
FIG. 1 is a simplified schematic diagram of a prior art amplifier circuit.

The invention encompasses bias circuits and methods for silicon-based CMOS amplifier architectures that are tolerant of supply and bias voltage variations, bias current variations, and transistor stack height, and compensate for the poor output resistance characteristics of silicon-based CMOS devices with short channel lengths. Further, the invention encompasses improved silicon-based CMOS amplifier architectures that can rapidly adapt to a changing radio frequency (RF) electrical environment, and which have good isolation. The disclosed amplifier architectures that are adaptable to a number of amplifier applications, including power amplifiers (PAs) and low-noise amplifiers (LNAs).

Embodiments of the invention utilize a cascode reference circuit to bias the final stages of a cascode amplifier under the control of a closed loop bias control circuit. The closed loop bias control circuit ensures that the current in the cascode reference circuit is approximately equal to a selected multiple of a known current value by adjusting the gate bias voltage to the final stage of the cascode amplifier. The final current through the cascode amplifier is a multiple of the current in the cascode reference circuit, based on a device scaling factor m representing the size of the transistor devices in the cascode amplifier versus the size of the transistor devices in the cascode reference circuit. A notable attribute of such an architecture is that the cascode reference circuit accommodates arbitrary variations in its supply voltage.

In some embodiments, the closed loop bias control circuit is digitally programmable such that the biased current through the cascode amplifier can be dynamically adjusted during operation. In some embodiments, in order to overcome the breakdown voltage liability of individual silicon-based CMOS devices, the cascode amplifier and/or the cascode reference circuit includes a "stack" of two or more series-connected silicon-based CMOS devices so that the total RF voltage swing occurring across the stack is distributed over two or more CMOS devices; the stack height of the cascode amplifier and the cascode reference circuit need not be the same.

More particularly, some desirable design criteria for a cascode reference circuit used to bias the final stages of a cascode amplifier under the control of a closed loop bias control circuit include:

Controlling the quiescent current, I_final, in the cascode amplifier such that I_final is a known scaling factor of I_mirror (i.e., I_final=m*I_mirror, where m is a constant scaling factor chosen in the design phase). This relation should hold over specified ranges for variations in process, voltage, and temperature. Any temperature profile (e.g., Zero Temperature Coefficient or ZTC, Proportional To Absolute Temperature or PTAT, Constant—$G_M$, etc.) in quiescent current that may be desirable for keeping the cascode amplifier within its specified limits for RF performance metrics may be implemented in the design of the I_mirror circuit.

In order to offset the poor output resistance of silicon-based CMOS devices with short channel lengths, an additional constraint is matching the corresponding drain voltages of the bottom (first) stage of the cascode amplifier and the cascode reference circuit. Theoretically, if the drain, source, and gate voltages of Mb1 and M1 match each other, then the current in the amplifier will accurately mirror the current in the reference circuit. Further, if the drain voltages and the gate voltages match between the bottom stage of the cascode reference circuit and the cascode amplifier, then the output impedance problem is greatly mitigated or even eliminated. A feedback control loop can keep current constant independent of voltage, effectively providing a higher output resistance for a current source.

Adequate RF isolation/filtering from the RF signal input node to the common bias node of the cascode reference circuit such that the RF input signal does not perturb or corrupt the operation of the cascode reference circuit at DC or low frequencies. A general rule of thumb is to keep the RF voltage swing on the common bias node at or below about 10 mV zero-to-peak. In general, this criterion imposes an additional requirement on the cascode reference circuit—namely, it must be able to drive a sometimes sizable filter capacitance while maintaining adequate gain and phase margin for stable closed loop operation and acceptable transient response.

Adequate RF isolation/filtering between higher stage devices in the cascode amplifier and corresponding stages of the cascode reference circuit.

Minimizing current, since current spent generating bias voltages is seen as overhead current for the amplifier and counted against the DC power consumption set by the amplifier efficiency specifications.

Providing a baseband bandwidth for the control loop that is sufficiently high to allow for high data-rate standards (such as LTE, W-CDMA, etc. in cellular telephone systems). Insufficient baseband bandwidth in the cascode reference circuit may lead to degradation of power amplifier performance metrics, manifested as poor or asymmetric Adjacent Channel Power Ratio (ACPR) characteristics, poor Error Vector Magnitude (EVM) characteristics, and more.

General Biasing Architecture for Cascode Amplifier

Figure 2A:
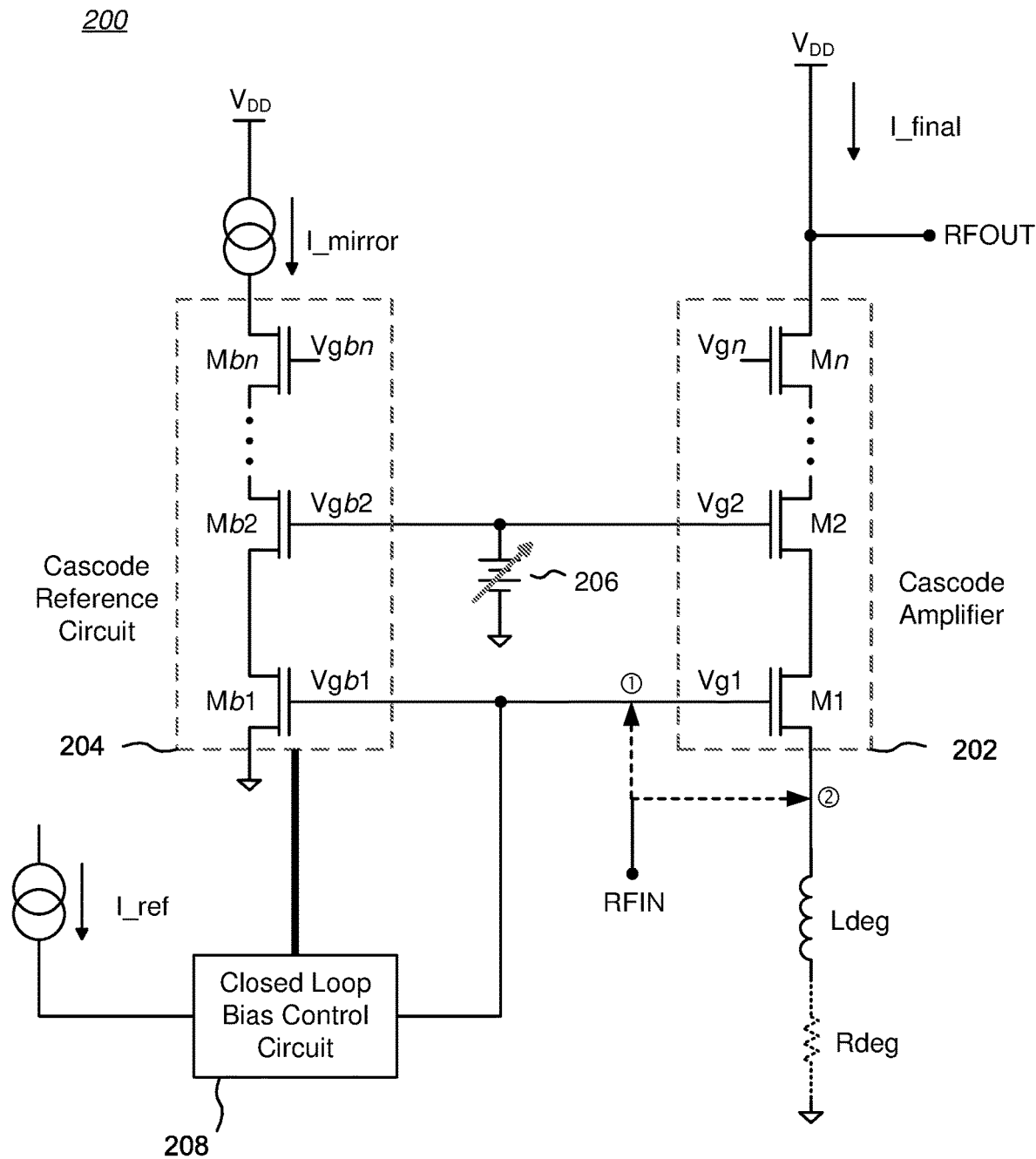
FIG. 2A is a simplified schematic diagram of a generalized embodiment of an amplifier circuit in accordance with the present invention.

FIG. 2A is a simplified schematic diagram of a generalized embodiment of an amplifier circuit 200 in accordance with the present invention. A cascode amplifier 202 comprising a stack of at least two serially-connected FETs M1-Mn is configured to receive an RF input signal, RFIN, either at a first node ① coupled to the gate of M1, or at a second node ② coupled to the source of M1. As used in this description, the term "RF" particularly includes frequencies from about 100 MHz and above. Applying the RF input signal to the source of a common gate amplifier (i.e., at the second node ②) usually offers input impedances that are conducive to a simple, broadband input match. The source of M1 may be coupled thorough a degeneration inductor Ldeg to RF ground. As noted above, the degeneration inductor Ldeg, which will also have an inherent resistance Rdeg (shown in dotted outline), performs several functions, including obtaining a good dynamic range (e.g., a good noise figure), achieving high sensitivity with low power consumption, and helping with input impedance matching. The drain of the top (last) FET Mn in the cascode amplifier 202 provides an amplified RF output signal, RFOUT.

As noted above, one drawback to silicon-based CMOS devices for amplifier applications, and particularly for power amplifier applications, is a relatively low breakdown voltage per device. One circuit configuration that overcomes the breakdown voltage liability associated with silicon-based CMOS devices is referred to as device "stacking", in which the total RF voltage swing occurring across a circuit is distributed over two or more serially-connected (i.e., "stacked") CMOS devices. Accordingly, as illustrated, the cascode amplifier 202 may be configured with n serially-connected FETs M1-Mn such that a particularly voltage level can be withstood without subjecting any of the constituent FETs to a voltage exceeding its breakdown voltage.

A cascode reference circuit 204 comprising a stack of at least two serially-connected FETs Mb1-Mbn is configured such that the gate of Mb1 is coupled to the gate of M1, and the gate of Mb2 is coupled to the gate of M2. Accordingly, any bias voltage Vg1 applied to M1 will be essentially the same as the bias voltage Vgb1 applied to Mb1, and any bias voltage Vg2 applied to M2 will be essentially the same as the bias voltage Vgb2 applied to Mb2. (Note that in many applications, each FET gate may include a corresponding gate resistor and gate capacitor, not shown for clarity; the gate capacitor sets up the RF voltage division in the stack and the resistor is used to isolate the RF signal from the DC bias circuit). As with the cascode amplifier 202, the cascode reference circuit 204 may be configured with a stack of n serially-connected FETs such that a particularly voltage level can be withstood without subjecting any of the constituent FETs to a voltage exceeding its breakdown voltage. The purpose of the cascode reference circuit 204 is to essentially act as a current mirror that sees bias voltages similar to the cascode amplifier 202, with the devices in the cascode reference circuit 204 being scaled-down replicas of the devices in the cascode amplifier 202. For example, if the devices in the cascode reference circuit 204 are 1/100 of the size of the devices in the cascode amplifier 202, the scaling factor m would be 100. (The size of such devices may be defined in terms of transistor area, gate length, gate width, etc., so long as the same aspect is compared; using gate length as a metric, it is particularly useful to fabricate the FETs in the cascode amplifier 202 and the cascode reference circuit 204 with gate lengths that are less than about 1 μm). The FET device stacking in the cascode reference circuit 204 replicates the bias voltages in the cascode amplifier 202 stack, thus resulting in a more accurate current mirror.

In general, the gate of each serially-connected FET M2-Mn in the cascode amplifier 202 is coupled to a bias voltage Vg2-Vgn, and the gate of each FET Mb2-Mbn in the cascode reference circuit 204 is coupled to a bias voltage Vgb2-Vgbn. In each case, the corresponding gate bias voltage generally will be a value derived from the system DC voltage $V_{DD}$, for example, through a shared resistive voltage divider or through corresponding dedicated resistive voltage dividers. However, in some embodiments, the bias voltage Vg2-Vgn for one or more of FETs M2-Mn in the cascode amplifier 202 may be essentially the same as the bias voltage Vgb2-Vgbn applied to the gates of the corresponding FETs Mb2-Mbn in the cascode reference circuit 204, such as by directly connected corresponding gates in the two circuits through an isolating filter (e.g., an RC filter).

To avoid unnecessary complication, the remainder of this disclosure will focus on the biasing to the bottom two stages of the cascode amplifier 202 and the cascode reference circuit 204. Because of the cascode architecture of the bottom two stages M1, M2 of the cascode amplifier 202, biasing of those two stages controls the amplification properties of the amplifier circuit 200. As illustrated, the gates of M2 in the cascode amplifier 202 and Mb2 in the cascode reference circuit 204 are both biased by a power source 206 derived from $V_{DD}$. While nominally having a fixed voltage in some applications, $V_{DD}$ may in fact exhibit a wide range of variability, intentionally or unintentionally, which would change all bias points in the cascode amplifier 202 and the cascode reference circuit 204. For example, a system incorporating the illustrated amplifier circuit 200 may utilize average power tracking (APT), or envelope tracking (ET), or a GSM power amplifier with drain control of the output power. In APT mode, $V_{DD}$ is typically modulated (e.g., by a DC-DC converter). In general, $V_{DD}$ may range from about 0.4V to about 4.5V (thus, the bias voltages Vg2-Vgn will normally be in the same range). To save power in a system, $V_{DD}$ may be set low (e.g., 0.4-1.0V) when little power is required in the cascode amplifier 202, such as when low power levels are being transmitted. Conversely, $V_{DD}$ may be set high (e.g., 4.2V) when higher power is required in the cascode amplifier 202, such as during periods of signal transmission. With APT, the average power typically varies over seconds or tens of seconds. ET mode sets $V_{DD}$ as a function of the signal modulation and accordingly $V_{DD}$ may vary at a microsecond or faster rate. In light of the actual voltage variation that may be present, whether intentional or unintentional, the power source 206 is shown as including a gray arrow to indicate variability (usually intentionally; it is difficult to precisely control the bias voltage as some function of the supply voltage or hold it constant depending on how the amplifier is designed to operate(.

Thus, a design challenge is to provide a suitable control circuit for the cascode reference circuit 204 that accommodates arbitrary variations in its supply voltages. In addition, a bias circuit for the multi-stage cascode amplifier 202 must be designed to handle the low device output resistance of silicon-based CMOS devices with short channel lengths.

To satisfy this design challenge, embodiments of the invention utilize the cascode reference circuit 204 to bias the final stages of the cascode amplifier 202 under the control of a closed loop bias control circuit 208. The closed loop bias control circuit 208 is connected to the cascode reference circuit 204 in such a way as to receive feedback of varying voltages and/or currents in the cascode reference circuit 204. The closed loop bias control circuit 208 utilizes such feedback to ensure that a current, I_mirror, in the cascode reference circuit 204 is approximately equal to a selected multiple of a known current value, I_ref, by adjusting the gate bias voltage Vg1, Vgb1 to the final stage M1 of the cascode amplifier 202 and the final stage Mb1 of the cascode reference circuit 204. The final current, I_final, through the cascode amplifier 202 is a multiple of I_mirror, based on the device scaling factor m representing the size of the transistor devices in the cascode amplifier 202 versus the size of the transistor devices in the cascode reference circuit 204. For example, if I_mirror is about 100 μA, and m equals 1000, then I_final would be about 100 mA. More generally, I_ref is a reference current that may be used to generate a current I_mirror that flows through the mirror devices. Since I_ref is a generic reference current, its presence (and the circuitry for generating it) is implied in the generation of I_mirror in the figures described below, if not shown explicitly.

As described in greater detail below, there are a number of ways of implementing the closed loop bias control circuit 208 to control I_mirror, and thus I_final, while allowing for arbitrary variations in supply voltage. In addition, some embodiments include circuitry for force matching drain-source voltages as well as of gate voltages in the cascode amplifier 202, in order to improve bias current mirroring accuracy.

An advantage of using a cascode reference circuit 204 to provide biasing to the cascode amplifier 202 is that corresponding drain voltages in the bottom stages (where the bottom stage of the cascode amplifier 202 is coupled to the RF input, as shown in FIG. 2A) of the two circuits can be forced to match in order to compensate for the poor output resistance of the FETs in the cascode reference circuit 204, whereas a simple mirror bias circuit lacks that characteristic.

Additional Amplifier Circuit Elements

Figure 2B:
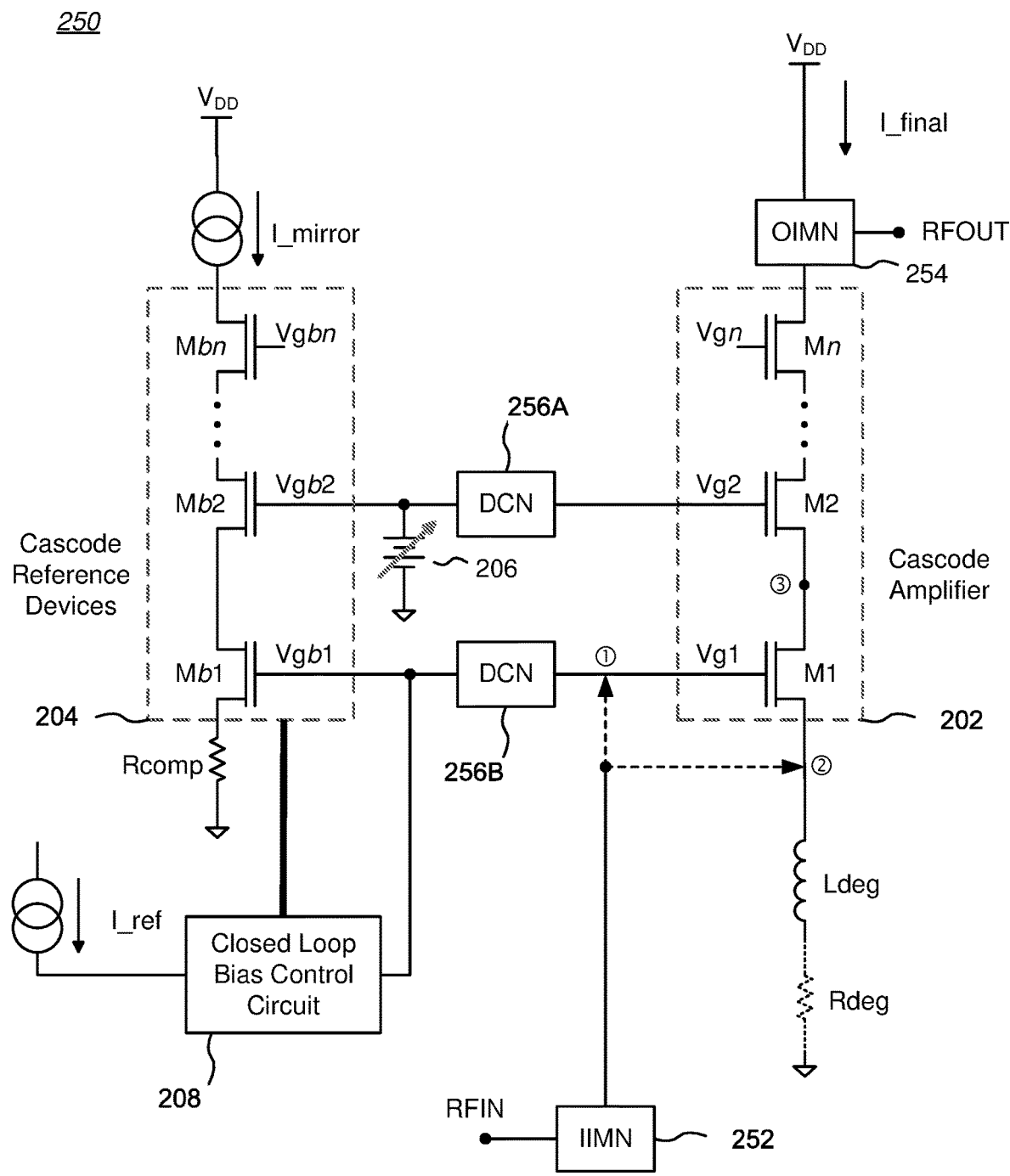
FIG. 2B is a more detailed amplifier circuit showing some additional elements that may be added to the amplifier circuit of FIG. 2A.

As should be apparent to one of skill in the art, the illustrated amplifier circuit 200 in FIG. 2A is highly simplified. In practical circuits, additional elements may be included for proper operation as an RF amplifier, such as bypass capacitors, filters, current sources, gate capacitors for RF voltage division, bias circuits such as bandgaps and such to generate the reference current, etc. As further examples, FIG. 2B is a more detailed amplifier circuit 250 showing some additional elements that may be added to the amplifier circuit 200 of FIG. 2A.

Figure 2C:
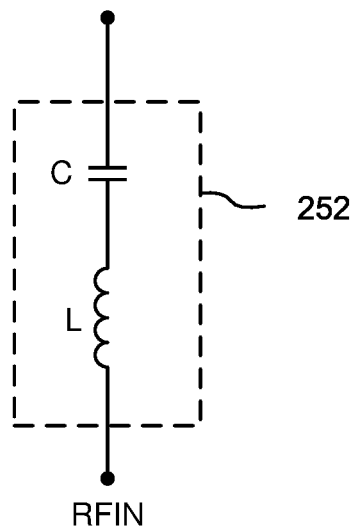
FIG. 2C is a schematic diagram of one embodiment of an input impedance matching network that may be used in conjunction with the circuit of FIG. 2B.

In some applications, the input signal RFIN may be first processed through an input impedance matching network (IIMN) 252. FIG. 2C is a schematic diagram of one embodiment of an input impedance matching network 252 that may be used in conjunction with the circuit of FIG. 2B. As illustrated, the IIMN 252 may comprise a series-connected inductor L and a DC-blocking capacitor C. As should be clear to one of ordinary skill, other input impedance matching networks may be used to achieve particular performance specifications.

Figure 2D:
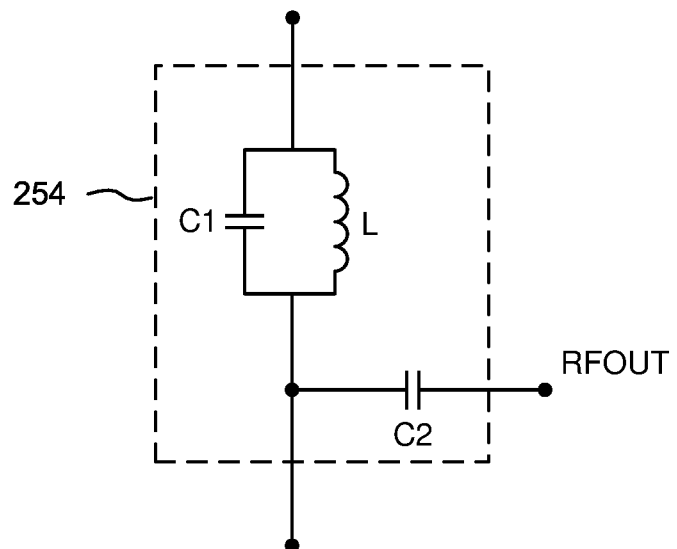
FIG. 2D is a schematic diagram of one embodiment of an output impedance matching network that may be used in conjunction with the circuit of FIG. 2B.

Similarly, in some applications, the output signal RFOUT may be first processed through an output impedance matching network (OIMN) 254. FIG. 2D is a schematic diagram of one embodiment of an output impedance matching network 254 that may be used in conjunction with the circuit of FIG. 2B. As illustrated, the OIMN 254 may comprise a tank circuit (comprising an inductor L and first capacitor C1 coupled in parallel in this example) connected to a second capacitor C2. As should be clear to one of ordinary skill, other output impedance matching networks may be used to achieve particular performance specifications.

In some applications, de-coupling networks (DCN) 256A, 256B may be inserted between the gates of Mb1, Mb2 of the cascode reference circuit 204 and the corresponding gates of M1, M2 of the cascode amplifier 202 to isolate the cascode reference circuit 204 from RFIN (particularly if RFIN is coupled to node ①). As one example, a DCN 256A, 256B may comprise an RC, LC, RL, or RLC circuit coupled between the gates of corresponding FETs (e.g., Mb1 and M1, or Mb2 and M2). For example, an RC circuit may include a high-value resistor (e.g., at least about 2 k ohms) coupled between the gates of corresponding FETs, plus a shunt capacitor coupled to RF ground. Note that the DCNs 256A, 256B need not be identical in architecture or component values, and that additional DCNs may be used if the gates of higher stage FETs in both the cascode amplifier 202 and the cascode reference circuit 204 are connected in common.

Figure 2E:
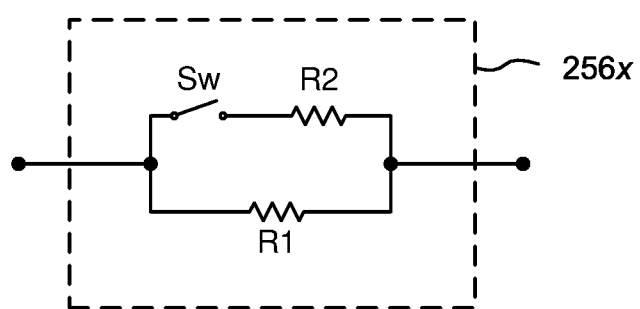
FIG. 2E is a schematic diagram of one embodiment of a switchable resistance de-coupling network that may be used in conjunction with the circuit of FIG. 2B.

As another example, a DCN 256A, 256B may comprise only a high-value resistor coupled between the gates of corresponding FETs, since there is no current into the gates. Alternatively, a DCN 256A, 256B may include a switchable network of resistors that allows selection of two or more different resistance values, where selection may be permanent (e.g., a mask-level selection during manufacture, or a fusible link setting in the field) or programmable. FIG. 2E is a schematic diagram of one embodiment of a switchable resistance de-coupling network 256x that may be used in conjunction with the circuit of FIG. 2B. A first resistor R1 is coupled in parallel with a series-connected second resistor R2 and switch Sw; the switch Sw may be, for example, permanently configurable (e.g., a mask-level selection during manufacture, or a fusible link setting in the field) or a software-controlled FET. With switch Sw set to "OPEN" (i.e., non-conducting or OFF), the total resistance of the illustrated DCN would be R1; with switch Sw set to "CLOSED" (i.e., conducting or ON), the total resistance of the DCN would be equal to R1×R2/(R1+R2). As should be clear, a switchable resistor network may provide more than two resistance levels (e.g., by including additional parallel switch/resistor pairs), and may be used in an R, RC, RL, or RLC de-coupling network circuit configuration.

In some applications, it is useful to compensate for the DC resistance in the inductor Ldeg (as represented by Rdeg) by inserting a compensation resistor Rcomp between RF ground and the source of Mb1 in the cascode reference circuit 204. The value of the compensation resistor Rcomp may be set to a multiple of Rdeg such that the voltage at the source of Mb1 closely approximates the voltage at the source of M1. Inserting a compensation resistor Rcomp may be done so that the operating conditions of the mirror device and amplifier device are as equal as possible for accurate mirroring of current.

It may be desirable to fabricate the compensation resistor Rcomp as a metal resistor so that the temperature coefficients and relative tolerances of the inductor Ldeg and the compensation resistor Rcomp essentially match. More particularly, during IC fabrication, Ldeg may be created with a spiral metal path, while Rcomp may be created with a serpentine or meandering metal path. Since Ldeg and Rcomp would be constructed from similar materials, they would have similar temperature coefficients and thus maintain essentially the same resistance values with respect to temperature changes. Even if Ldeg and Rcomp were constructed of different metals (e.g., aluminum for one, copper for the other), the temperature coefficients generally would be comparable. In contrast, if Ldeg and Rcomp were constructed from significantly different materials (e.g., implanted poly for Rcomp, metal for Ldeg), they would have much different temperature coefficients and thus vary significantly in resistance as the temperature changed.

When a reference current source is specified, it may be implemented with a bandgap voltage reference across a resistor to generate a specified reference current. A bandgap voltage reference is a temperature independent voltage reference circuit widely used in integrated circuits, and produces an essentially constant voltage regardless of power supply variations, temperature changes, and circuit loading.

It may be noted also that in some integrated circuit embodiments, the gates of FETs M1 and M2 are merged, and thus and there is no accessible contact between the devices (node ③ in FIG. 2B), which essentially prevents being able to monitor or sense the actual voltage at that node, thus limiting the types of circuits that may be used for the closed loop bias control circuit 208.

Bias Control Circuit Embodiments—General Comments

Various embodiments of closed loop bias control circuits are described in the following sections referencing FIG. 3 through FIG. 8. In each case, for clarity, the cascode amplifier 202 is represented as a simplified rectangular component with only the bias inputs Vg1, Vg2 for the bottom two stages of n stages explicitly shown, and the figures omit RFIN, RFOUT, and the additional elements shown in FIGS. 2B-2E and/or described above. The cascode reference circuit 204 is shown with a stack height of two, but additional FETs may be serially connected to increase the stack height to handle the applied supply voltages, as described above. Further, when the mirror current circuitry is shown connected to $V_{DD}$, alternatively such circuitry may be connected to another power supply, such as an internally regulated supply.

First Bias Control Circuit Embodiment

Figure 3:
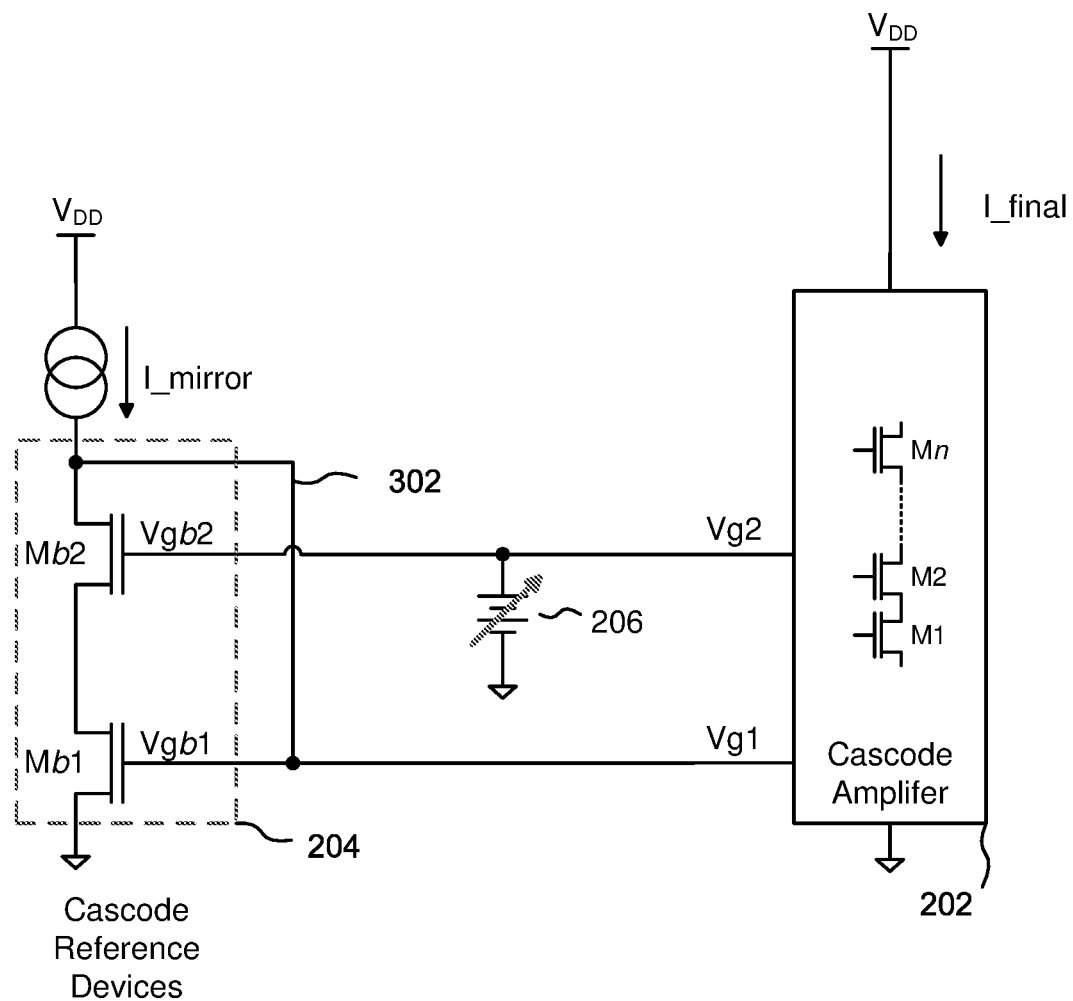
FIG. 3 is a simplified schematic diagram of an amplifier circuit having a cascode reference circuit configured with a first closed loop bias control circuit.

FIG. 3 is a simplified schematic diagram of an amplifier circuit 300 having a cascode reference circuit 204 configured with a first closed loop bias control circuit. The closed loop bias control circuit 208 of FIG. 2A may be simply implemented as a connection between a current source I_mirror applied to the drain of FET Mb2 and the gate of FET Mb1 of the cascode reference circuit 204, thereby connecting Mb1 in a diode configuration. In this configuration, the cascode amplifier 202 and the cascode reference circuit 204 share common bias voltages for the bottom two stages (where "bottom" means the stage of the cascode amplifier 202 coupled to the RF input, as shown in FIG. 2A). Thus, the drain voltages of the bottom devices in each circuit, M1, Mb1, should match, thereby improving current mirroring accuracy in the cascode amplifier 202. Because of the stacked architecture of a cascode amplifier 202 (at least two series-connected devices), the architecture is better suited to handle practical supply voltages, particularly when using silicon-based CMOS devices.

In operation, the current source I_mirror will force current into the stack of Mb2 and Mb1 by adjusting the gate voltage Vgb1 until the full value of the current, I_mirror, is delivered through the stack of FETs in the cascode reference circuit 204. This will occur to a large extent as the cascode bias Vgb2 varies. The current in the cascode reference circuit 204 will be mirrored into the cascode amplifier 202 as I_final: I_final=m*I_mirror (where m is the device scaling factor, as described more generally above). The accuracy with which the mirroring occurs is depends on the device ratio, layout matching, and other physical parameters, as well as on the gate, source, and drain voltages of the reference FET Mb1 and corresponding amplifier device M1 being essentially equal (perfectly equal, in the ideal case). The inclusion of the cascode FET Mb2 and the equivalent FET M2 in the cascode amplifier 202 help keep the drain voltages on the bottom devices Mb1, M1, equal. If the FET output resistances of the bottom two FETs of the cascode amplifier were ideal (i.e., essentially infinite), one would simply have to match the gate and source voltages of those devices. However, due to the poor output resistance of the actual devices, the currents do not match if the drain voltages do not match each other exactly. Accordingly, the cascode reference circuit 204 is included to force the drain voltages to match. Again, because of poor device output resistance, it may be important to match other gate, source, and drain voltages in the stack to ensure current matching (and possibly the drain voltages higher in the two stacks as well).

Second Bias Control Circuit Embodiment

Figure 4:
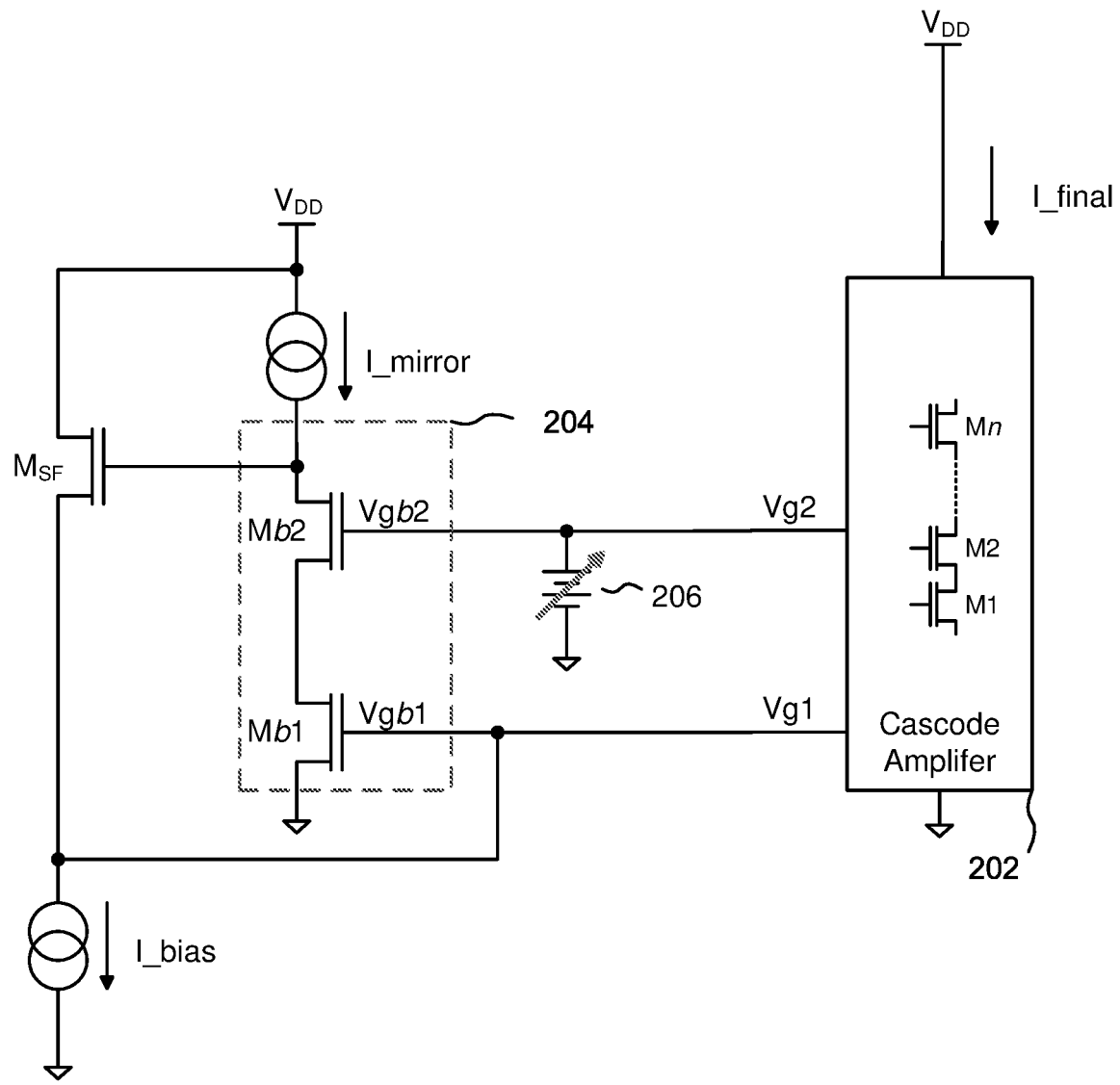
FIG. 4 is a simplified schematic diagram of an amplifier circuit having a cascode reference circuit configured with a second closed loop bias control circuit.

FIG. 4 is a simplified schematic diagram of an amplifier circuit 400 having a cascode reference circuit 204 configured with a second closed loop bias control circuit. The closed loop bias control circuit 208 of FIG. 2A is implemented by including a source follower FET $M_{SF}$ to drive (i.e., bias) the gates of the bottom stage devices, M1, Mb1. A bias current source I_mirror is coupled to the cascode reference circuit 204 as shown. With respect to FET $M_{SF}$, its drain is coupled to $V_{DD}$, its gate is coupled to the drain of Mb2, and its source is coupled to a bias current source I_bias and to the gates of M1 and Mb1. Accordingly, FET $M_{SF}$ supplies the bias voltages Vg1 and Vgb1 to the gates of M1 and Mb1, respectively. The source follower $M_{SF}$ also adds a voltage offset from the drain of Mb2 to the gate of Mb1; additional diode offsets or source follower devices may be added for an increased voltage offset.

The illustrated amplifier circuit 400 operates in a similar manner to the circuit in FIG. 3, except that use of the source follower helps increase the drain voltage seen on Mb2, which may in many cases more closely mimic the voltage seen by the equivalent device M2 in the cascode amplifier 202.

Third Bias Control Circuit Embodiment

Figure 5:
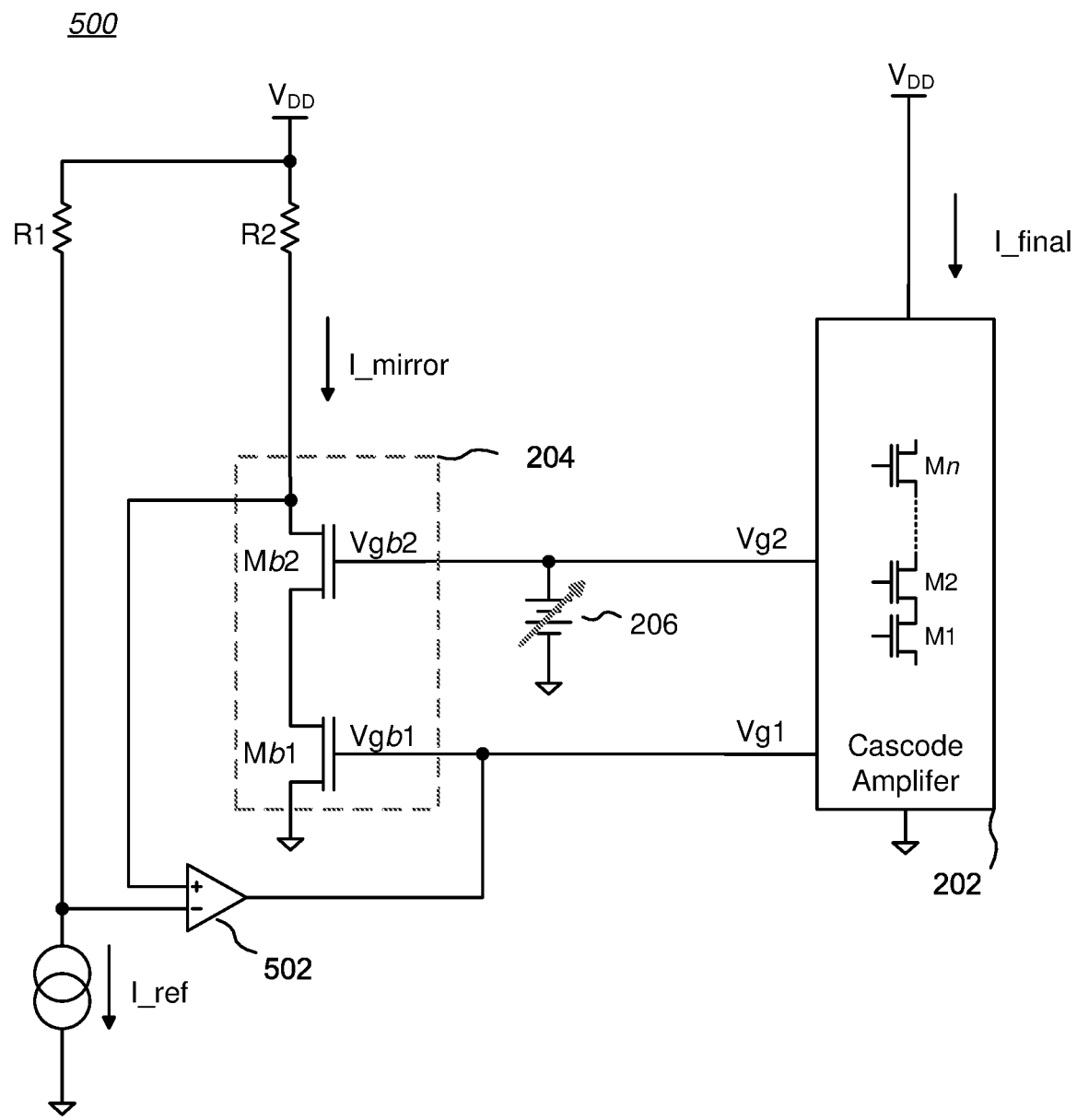
FIG. 5 is a simplified schematic diagram of an amplifier circuit having a cascode reference circuit configured with a third closed loop bias control circuit.

FIG. 5 is a simplified schematic diagram of an amplifier circuit 500 having a cascode reference circuit 204 configured with a third closed loop bias control circuit. In this embodiment, the closed loop bias control circuit 208 of FIG. 2A is implemented as an operational amplifier (op-amp) 502 having one input coupled to the drain of FET Mb2, while the other input is coupled between a first resistor R1 coupled to $V_{DD}$ and a reference current source I_ref. A second resistor R2 is coupled to the drain of Mb2; current I_mirror flows through R2 to the cascode reference circuit 204. The output of the op-amp 502 is coupled as the bias voltages Vg1 and Vgb1 to the gates of M1 and Mb1, respectively.

In operation, the op-amp 502 actively responds to differences in its inputs by varying the bias voltages Vg1 and Vgb1 to the gates of M1 and Mb1 to adjust the current I_mirror through the reference device stack 204 so that the voltage drop across R1 equals the voltage drop across R2. Simultaneously, the drain voltages of M1 and Mb1 are confined to be the same by the common gate bias connection to M2 and Mb2. This results in the current I_mirror being a function of the reference current I_ref, such that the ratio I_mirror/I_ref equals R1/R2. The control loop keeps the drain voltage of the cascode reference circuit 204 mirror stack equal to $V_{DD}$−I_ref*R1. This is beneficial because it means the drain voltage can be controlled by setting selected values for R1, R2, and I_ref.

Another benefit of the illustrated embodiments is that the drain voltage of the cascode reference circuit 204 may be adjusted as a function of temperature, supply voltage, or other factors by a suitable choice of I_ref, R1, and/or R2. As should be clear, R1 and/or R2 may be fabricated so as to have selectable values (e.g., via a mask-level selection during manufacture, or a fusible link setting in the field) or programmable values.

Fourth Bias Control Circuit Embodiment

Figure 6:
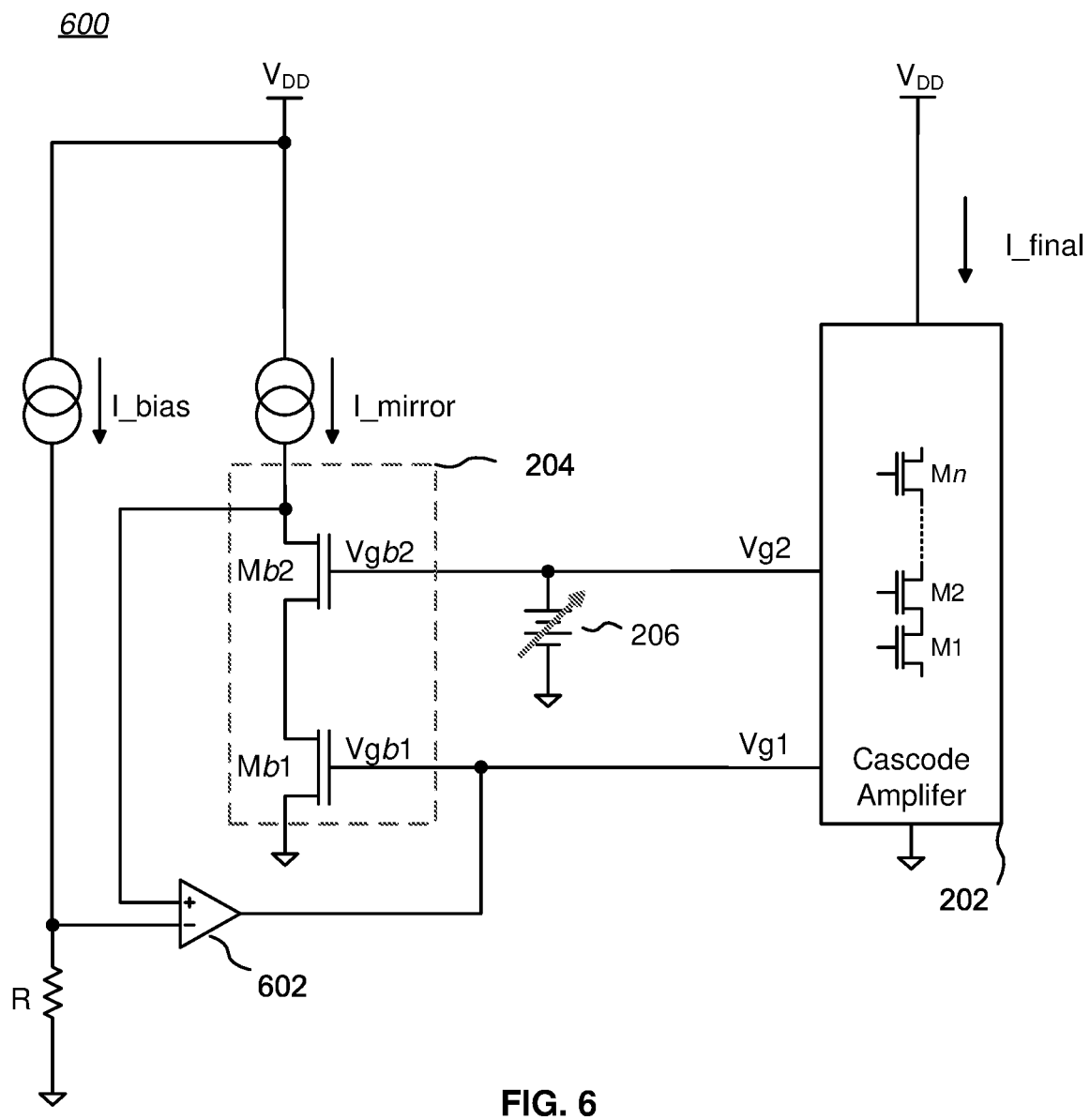
FIG. 6 is a simplified schematic diagram of an amplifier circuit having a cascode reference circuit configured with a fourth closed loop bias control circuit.

FIG. 6 is a simplified schematic diagram of an amplifier circuit 600 having a cascode reference circuit 204 configured with a fourth closed loop bias control circuit. This embodiment operates on essentially the same principle as the amplifier circuit 500 of FIG. 5, but using current sources I_mirror, I_bias rather than resistors. More particularly, an op-amp 602 has one input coupled to the drain of FET Mb2, while the other input is coupled between a reference current source I_bias and a resistor R coupled to RF ground. The output of the op-amp 502 is coupled as the bias voltages Vg1 and Vgb1 to the gates of M1 and Mb1, respectively. The desired drain voltage for Mb2 is set by the value of R*I_bias. The closed loop circuit works to keep the drain voltage of Mb2 equal to R*I_bias while adjusting Vgb1 until the drain voltage condition is met and the cascode reference stack 204 conducts a current equal to I_mirror.

Fifth Bias Control Circuit Embodiment

Figure 7:
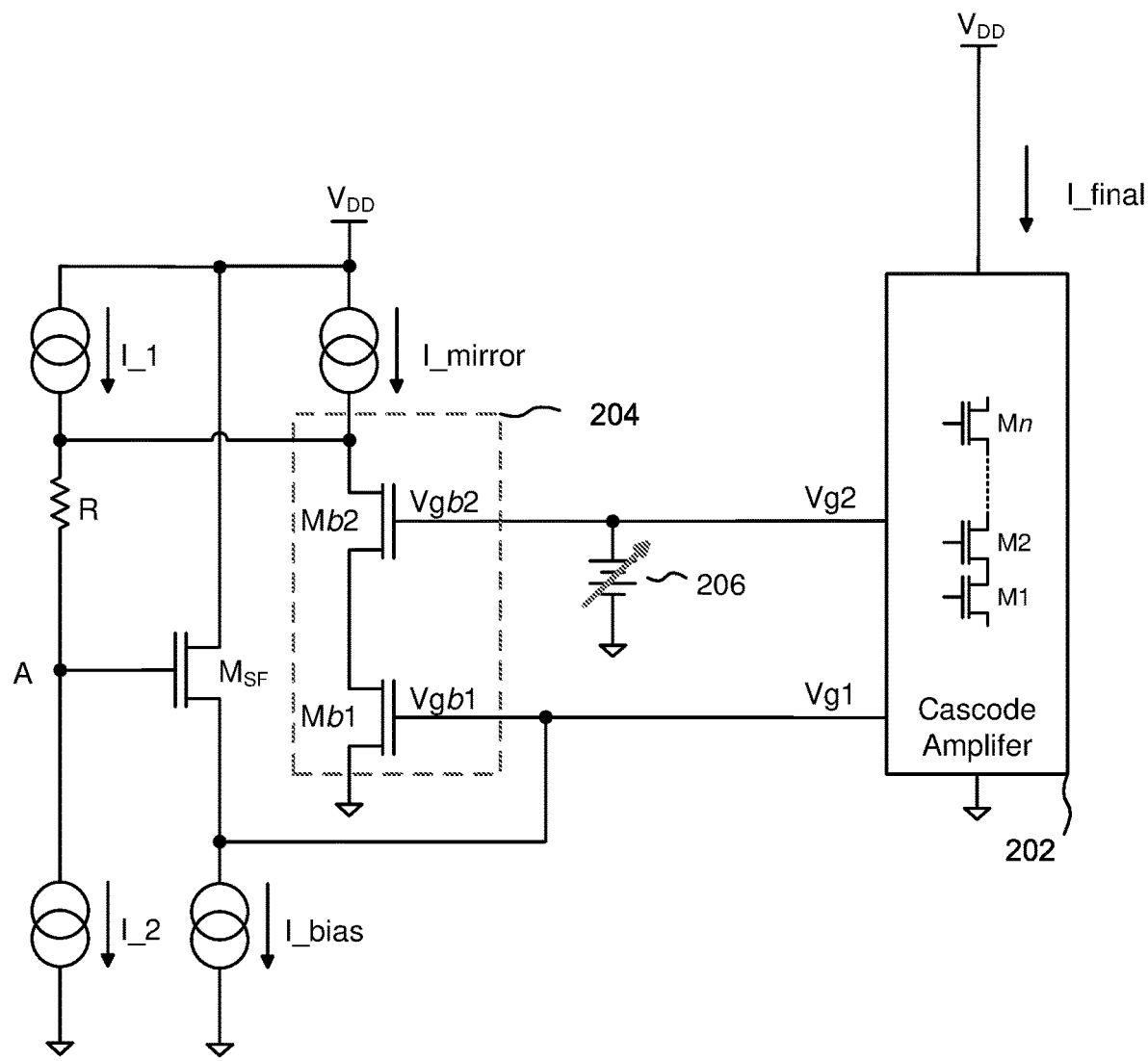
FIG. 7 is a simplified schematic diagram of an amplifier circuit having a cascode reference circuit configured with a fifth closed loop bias control circuit.

FIG. 7 is a simplified schematic diagram of an amplifier circuit 700 having a cascode reference circuit 204 configured with a fifth closed loop bias control circuit. A bias current source I_bias is coupled to the cascode reference circuit 204 as shown. The illustrated amplifier circuit 700 uses a voltage offset circuit between the drain of Mb2 and the gate of Mb1, rather than using an op-amp to close the control loop. Among other ways, the voltage offset circuit may be realized using series-connected current sources I_1 and I_2 and a resistor R (also connected to the drain of Mb2) to provide a voltage at node A that is coupled to the gate of a source follower FET $M_{SF}$. The source follower $M_{SF}$, coupled as shown between $V_{DD}$ and a current source I_mirror, as well as to the gates of M1 and Mb1, behaves as a buffer to allow somewhat arbitrary choices of resistor values and current sources, and is responsible for driving the gates of the bottom stage devices M1, Mb1.

The illustrated amplifier circuit 700 operates in a similar manner to the circuit in FIG. 4, except that the current sources I_1, _2 and the resistor R essentially act as a "virtual battery" or voltage source that increases the voltage between the drain of Mb2 and the gate of the source follower Msf, which is useful in controlling the drain voltage of Mb2.

Sixth Bias Control Circuit Embodiment

Figure 8:
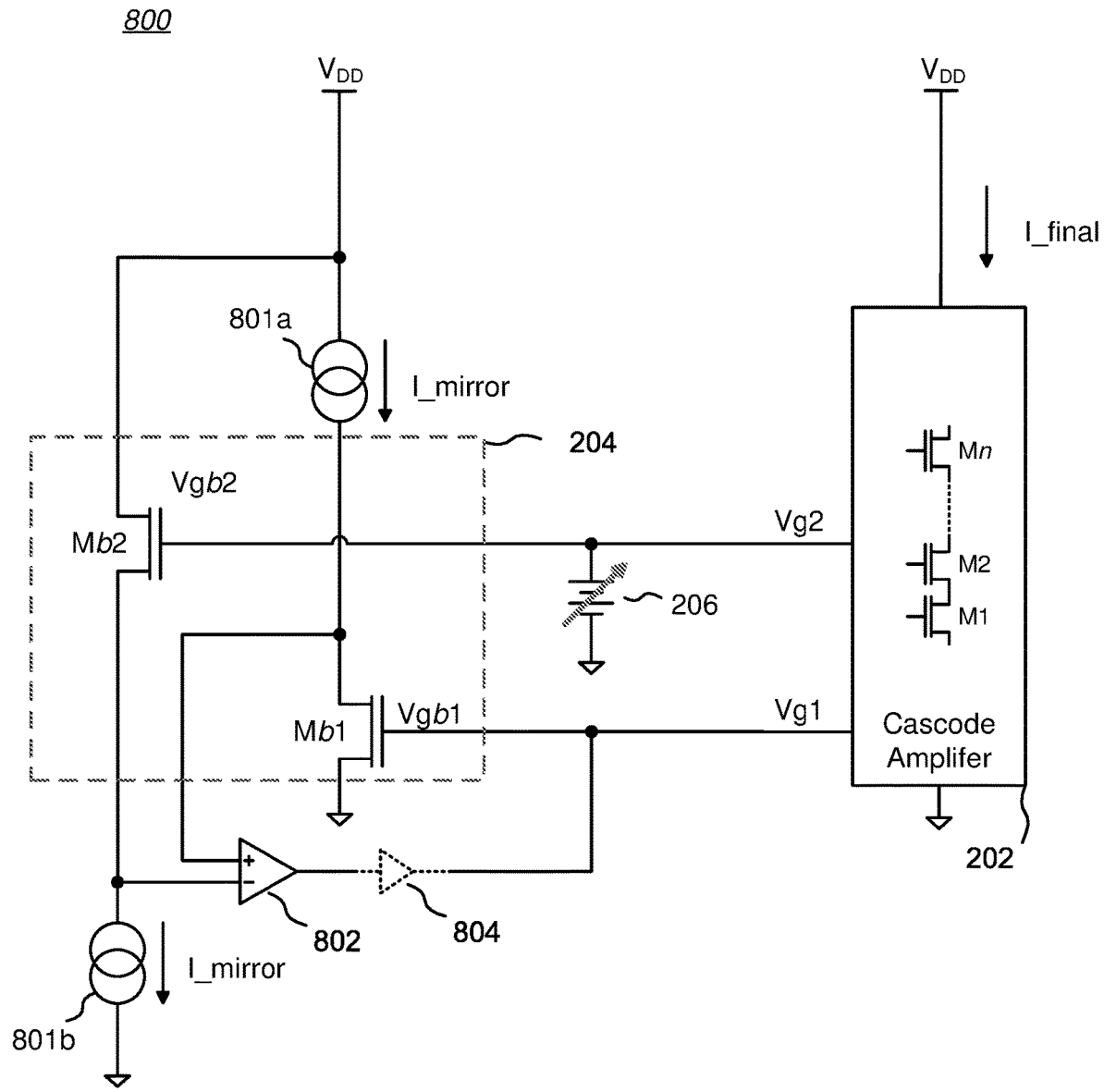
FIG. 8 is a simplified schematic diagram of an amplifier circuit having a cascode reference circuit configured with a sixth closed loop bias control circuit.

FIG. 8 is a simplified schematic diagram of an amplifier circuit 800 having a "split" cascode reference circuit 204 configured with a sixth closed loop bias control circuit. The illustrated circuit splits FETs Mb1 and Mb2 so that there are not series connected. (Technically, the reference circuit is not cascaded, since the cascode elements are split into two separate circuits. However, the "split" cascode reference circuit is designed to mimic/track the voltages seen in a cascode circuit and supplies bias voltages to the cascode amplifier 202 in a manner similar to the true cascode reference circuits shown in the embodiments described above, and as described in greater detail below. Accordingly, the "split" cascode reference circuit is referred to here as simply a "cascode reference circuit 204").

FET Mb1 is coupled between a first reference current source 801a providing a current I_mirror and RF ground; FET Mb2 is coupled between a second current source 801b providing the same current I_mirror and $V_{DD}$. An op-amp 802 has one input coupled to the drain of FET Mb1, while the other input is coupled to the source of FET Mb2 and to the current source I_mirror. The output of the op-amp 802 is coupled as the bias voltages Vg1 and Vgb1 to the gates of M1 and Mb1, respectively.

In operation, the op-amp 802 actively responds to differences in its inputs by varying the gate bias voltages Vg1, Vgb1 such that the current I_mirror through FET Mb1 equals the current I_mirror through FET Mb2. This circuit effectively splits a cascode into two pieces and uses the op-amp 802 to equalize the circuits. FET Mb2, coupled to FET M2, acts as the cascode device. The source voltage of FET Mb2 ideally represents the voltage at the source of FET M2 and the drain of FET M1 in the cascode amplifier 202 (i.e., node ③ in FIG. 2B), which ideally should match the drain voltage of the reference FET Mb1. The op-amp 802 adjusts the gate bias voltage Vgb1 so that the drain voltage of the reference FET Mb1 matches the drain voltage of FET M1 in the cascode amplifier 202 when I_final=m*I_mirror.

The amplifier circuit 800 optionally may include a buffer circuit 804 (shown in dotted outline) to drive the gate voltage and associated capacitance of FETs Mb1 and M1. If present, the buffer circuit 804 may be configured like the source follower $M_{SF}$ buffer circuit of FIG. 7.

Digitally Programmable Bias

In some applications, it is useful to programmatically set a bias level such that the biased current through the cascode amplifier 202 can be adjusted by software control during operation. A digitally programmable bias level enables controlling performance metrics for various operational scenarios, and provides two main benefits that are not possible with a static fixed bias. First, a programmable bias level allows for design optimization of a product after fabrication. This simplifies design by reducing the need for precise bias design pre-fabrication with the confidence that the final product can be adjusted to meet specifications. Post-fabrication optimization also allows for the same product to be adjusted to meet different specifications, thus allowing one product to meet multiple demands with very fast time to market. Second, a programmable bias level allows for dynamically changing bias (and thus performance) during operation. This allows for better performance (where a static bias may underperform) and/or efficient performance (where a static bias may be wasteful and over-perform). In many applications, a software-based approach to adjusting bias is preferable to a physical approach such as varying the external bias voltage applied to the product.

One way of programmatically setting bias levels is to include a software switchable resistance de-coupling network (DCN) similar to the circuit shown in FIG. 2E. Selecting either R1 or R1∥R2 in such a DCN would adjust how fast the circuit reacts. For example, selecting a higher value resistance (e.g., only R1) for the DCN 256B in FIG. 2B better isolates the cascode reference circuit 204 from the cascode amplifier 202 so that the impedance seen by the RF input signal, RFIN, is more isolated from the cascode amplifier 202, and noise from the cascode reference circuit 204 to the cascode amplifier 202 is reduced. However, a high value resistance increases DC settling time. Programmatically selecting a lower value resistance (e.g., R1∥R2) for the DCN during a transition operating period allows the cascode amplifier 202 to quickly adapt to the new condition. The DCN can be programmatically switched back to a higher value resistance during a static operating period.

In an alternative configuration, a DCN similar to the circuit shown in FIG. 2E may be settable to one of several selectable resistance values. For example, by making the switch Sw a fusible link, the default resistance would be R1∥R2. Blowing the link post-fabrication would allow the resistance to be changed to R1. Other techniques may be used for permanently selecting the configuration of such a DCN, such as by a grounding or voltage pin or pad for a FET switch, or a wire-bonding connection option.

In either case, as noted above, a switchable network DCN may provide more than two resistance levels (e.g., by including additional parallel switch/resistor pairs), and may be used in an R, RC, RL, or RLC de-coupling network circuit configuration.

In other embodiments, one or more of the current sources in the cascode reference circuit 204 may be programmable or settable current sources, such as current digital-to-analog converters (DACs). Selectable current output levels allow programmatic setting of bias levels.

Alternatives

As should be apparent from the above descriptions of cascode reference circuits configured with a closed loop bias control circuit, there are many possible variations to this circuit concept. However, a common basic concept is using a control loop to ensure that the current in a cascode reference circuit is approximately equal to a selected multiple of a known current value by adjusting the gate bias voltage to the bottom stage of a cascode amplifier, such that the mirrored final current through the cascode amplifier is a multiple of the current in the cascode reference circuit. Another common basic concept is matching the corresponding drain voltages of the bottom stages of the cascode amplifier and the cascode reference circuit in order to provide better current mirroring accuracy.

Stated another way, the invention encompasses an amplifier circuit including: a cascode amplifier having at least two serially connected FET stages; a cascode reference circuit having at least two serially connected FET stages, the gates of the last two stages being coupled to the corresponding gates of the last two stages of the cascode amplifier, for biasing the cascode amplifier to output a final current approximately equal to a multiple of a mirror current in the cascode reference circuit; and a closed loop bias control circuit, having at least one input coupled to the cascode reference circuit and an output coupled to the gates of the last stage of the cascode amplifier and of the cascode reference circuit, responsive to variations in voltage and/or current in the cascode reference circuit to output an adjustment gate bias voltage applied to the last stage of the cascode amplifier and of the cascode reference circuit that forces the mirror current in the cascode reference circuit to be approximately equal to a selected multiple of a known reference current value.

Methods

Figure 9:
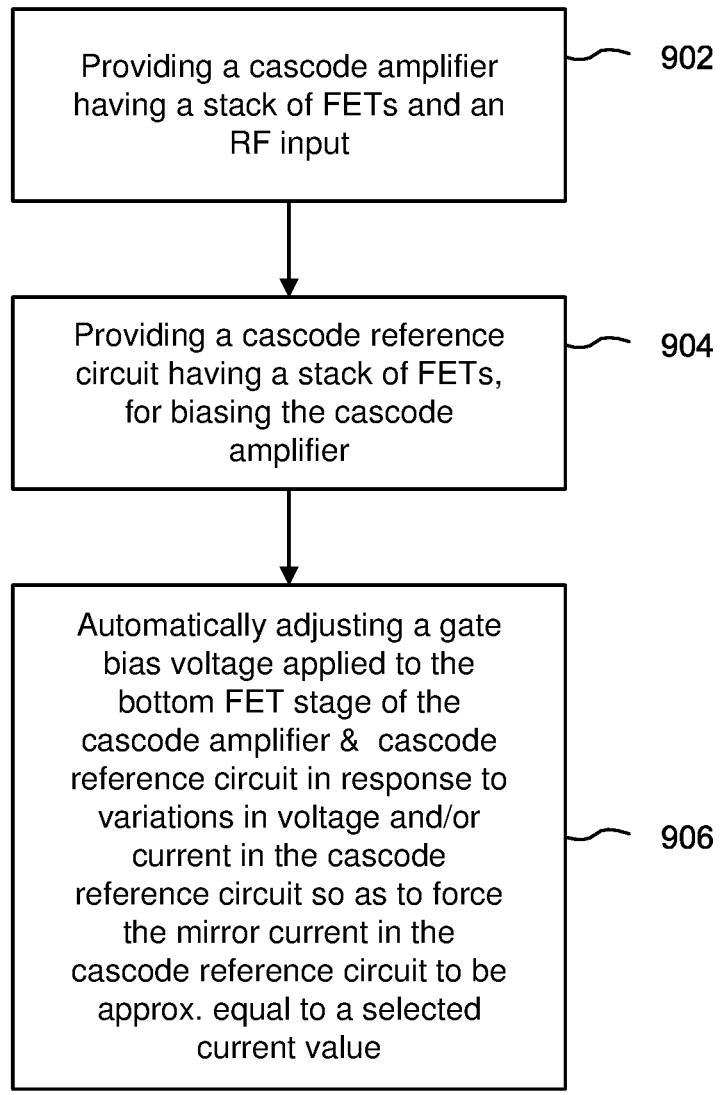
FIG. 9 is a flowchart showing one method for automatically biasing the final stages of a cascode amplifier.

Another aspect of the invention includes biasing the final stages of a cascode amplifier under the control of a closed loop bias control circuit. For example, FIG. 9 is a flowchart 900 showing one method for automatically biasing the final stages of a cascode amplifier. The method includes providing a cascode amplifier having at least two serially connected field effect transistor (FET) stages, each FET stage having a gate, a drain, and a source, the bottom FET stage having an input configured to be coupled to an RF input signal to be amplified, and the top FET stage of the cascode amplifier having an output for providing an amplified RF input signal (STEP 902); providing a cascode reference circuit having at least two serially connected FET stages, each FET having a gate, a drain, and a source, the gates of the bottom two FET stages of the cascode reference circuit being coupled to the corresponding gates of the bottom two FET stages of the cascode amplifier, for biasing the cascode amplifier to output a final current approximately equal to a multiple of a mirror current in the cascode reference circuit (STEP 904); and automatically adjusting a gate bias voltage applied to the respective gates of the bottom FET stage of the cascode amplifier and of the cascode reference circuit in response to variations in voltage and/or current in the cascode reference circuit so as to force the mirror current in the cascode reference circuit to be approximately equal to a selected current value (STEP 906).

Yet another aspect of the invention includes alternative methods for biasing the final stages of a cascode amplifier, including:

providing a cascode amplifier having at least two serially connected field effect transistor (FET) stages, each FET stage having a gate, a drain, and a source, the bottom FET stage having an input configured to be coupled to an RF input signal to be amplified, and the top FET stage of the cascode amplifier having an output for providing an amplified RF input signal; providing a cascode reference circuit having at least two serially connected FET stages, each FET having a gate, a drain, and a source, the gates of the bottom two FET stages of the cascode reference circuit being coupled to the corresponding gates of the bottom two FET stages of the cascode amplifier, for biasing the cascode amplifier to output a final current approximately equal to a multiple of a mirror current in the cascode reference circuit; and coupling a current source to the drain of the top FET stage of the cascode reference circuit and to the respective gates of the bottom FET stages of the cascode reference circuit and the cascode amplifier; wherein the respective gates of the bottom FET stages of the cascode reference circuit and the cascode amplifier are responsive to variations in voltage in the cascode reference circuit such that the mirror current in the cascode reference circuit is forced to be approximately equal to a selected current value;

providing a cascode amplifier having at least two serially connected field effect transistor (FET) stages, each FET stage having a gate, a drain, and a source, the bottom FET stage having an input configured to be coupled to an RF input signal to be amplified, and the top FET stage of the cascode amplifier having an output for providing an amplified RF input signal; providing a cascode reference circuit having at least two serially connected FET stages, each FET having a gate, a drain, and a source, the gates of the bottom two FET stages of the cascode reference circuit being coupled to the corresponding gates of the bottom two FET stages of the cascode amplifier, for biasing the cascode amplifier to output a final current approximately equal to a multiple of a mirror current in the cascode reference circuit; coupling a current source to the drain of the top FET stage of the cascode reference circuit; and providing a source follower FET having a gate, a drain, and a source, the drain of the source follower FET being coupled to a voltage source, the gate of the source follower FET being coupled to the drain of the top FET stage of the cascode reference circuit, and the source of the source follower FET being coupled to a bias current source and to the gates of the bottom FET stages of the cascode reference circuit and the cascode amplifier, the source follower FET being responsive to variations in voltage and/or current in the cascode reference circuit to output an adjustment gate bias voltage applied to the respective gates of the bottom FET stage of the cascode amplifier and of the cascode reference circuit that forces the mirror current in the cascode reference circuit to be approximately equal to a selected current value;

providing a cascode amplifier having at least two serially connected field effect transistor (FET) stages, each FET stage having a gate, a drain, and a source, the bottom FET stage having an input configured to be coupled to an RF input signal to be amplified, and the top FET stage of the cascode amplifier having an output for providing an amplified RF input signal; providing a cascode reference circuit having at least two serially connected FET stages, each FET having a gate, a drain, and a source, the gates of the bottom two FET stages of the cascode reference circuit being coupled to the corresponding gates of the bottom two FET stages of the cascode amplifier, for biasing the cascode amplifier to output a final current approximately equal to a multiple of a mirror current in the cascode reference circuit; and providing an op-amp having a first and a second input and an output, the first input being coupled between a voltage source through a first resistor and a reference current source, the second input being coupled between the voltage source through a second resistor and the drain of the top FET stage of the cascode reference circuit, the output being coupled to the respective gates of the bottom FET stages of the cascode reference circuit and the cascode amplifier, wherein the op-amp is responsive to differences between its first and second inputs and outputs an adjustment gate bias voltage applied to the respective gates of the bottom FET stage of the cascode amplifier and of the cascode reference circuit that forces the mirror current in the cascode reference circuit to be approximately equal to a selected current value;

providing a cascode amplifier having at least two serially connected field effect transistor (FET) stages, each FET stage having a gate, a drain, and a source, the bottom FET stage having an input configured to be coupled to an RF input signal to be amplified, and the top FET stage of the cascode amplifier having an output for providing an amplified RF input signal; providing a cascode reference circuit having at least two serially connected FET stages, each FET having a gate, a drain, and a source, the gates of the bottom two FET stages of the cascode reference circuit being coupled to the corresponding gates of the bottom two FET stages of the cascode amplifier, for biasing the cascode amplifier to output a final current approximately equal to a multiple of a mirror current in the cascode reference circuit; and providing an op-amp having a first and a second input and an output, the first input being coupled between a reference current source and a resistor coupled to circuit ground, the second input being coupled between a mirror current source and the drain of the top FET stage of the cascode reference circuit, the output being coupled to the respective gates of the bottom FET stages of the cascode reference circuit and the cascode amplifier, wherein the op-amp is responsive to differences between its first and second inputs and outputs an adjustment gate bias voltage applied to the respective gates of the bottom FET stage of the cascode amplifier and of the cascode reference circuit that forces the mirror current in the cascode reference circuit to be approximately equal to a selected current value;

providing a cascode amplifier having at least two serially connected field effect transistor (FET) stages, each FET stage having a gate, a drain, and a source, the bottom FET stage having an input configured to be coupled to an RF input signal to be amplified, and the top FET stage of the cascode amplifier having an output for providing an amplified RF input signal; providing a cascode reference circuit having at least two serially connected FET stages, each FET having a gate, a drain, and a source, the gates of the bottom two FET stages of the cascode reference circuit being coupled to the corresponding gates of the bottom two FET stages of the cascode amplifier, for biasing the cascode amplifier to output a final current approximately equal to a multiple of a mirror current in the cascode reference circuit; coupling a first current source to the drain of the top FET stage of the cascode reference circuit; providing a voltage offset circuit including a resistor series-connected between current sources I_1 and current source I_2, the drain of the top FET stage of the cascode reference circuit being coupled between the resistor and the current source I_1; and providing a source follower FET having a gate, a drain, and a source, the drain of the source follower FET being coupled to a voltage source, the source of the source follower FET being coupled to a second current source and to the respective gates of the bottom FET stages of the cascode reference circuit and the cascode amplifier, and the gate of the source follower FET being coupled to the voltage offset circuit between the resistor and the current source I_2, the source follower FET being responsive to variations in voltage and/or current in the cascode reference circuit to output an adjustment gate bias voltage applied to the respective gates of the bottom FET stage of the cascode amplifier and of the cascode reference circuit that forces the mirror current in the cascode reference circuit to be approximately equal to a selected current value;

providing a cascode amplifier having at least two serially connected field effect transistor (FET) stages, each FET stage having a gate, a drain, and a source, the bottom FET stage having an input configured to be coupled to an RF input signal to be amplified, and the top FET stage of the cascode amplifier having an output for providing an amplified RF input signal; providing a split cascode reference circuit having at least two FET stages, each FET having a gate, a drain, and a source, the gates of the bottom two FET stages of the cascode reference circuit being coupled to the corresponding gates of the bottom two FET stages of the cascode amplifier, for biasing the cascode amplifier to output a final current approximately equal to a multiple of a mirror current in the cascode reference circuit, the drain of the bottom FET stage of the cascode reference circuit being coupled to a first mirror current source and the source of the bottom FET stage of the cascode reference circuit being coupled to circuit ground, and the drain of the next-to-bottom FET stage of the cascode reference circuit being coupled to a voltage source and the source of the next-to-bottom FET stage of the cascode reference circuit being coupled to a second mirror current source; and providing an op-amp having a first and a second input and an output, the first input being coupled to the source of the next-to-bottom FET stage of the cascode reference circuit, the second input being coupled to the drain of the bottom FET stage of the cascode reference circuit, the output being coupled to the respective gates of the bottom FET stages of the cascode reference circuit and the cascode amplifier, wherein the op-amp is responsive to differences between its first and second inputs and outputs an adjustment gate bias voltage applied to the respective gates of the bottom FET stage of the cascode amplifier and of the cascode reference circuit that forces the mirror current in the cascode reference circuit to be approximately equal to a selected current value.

The above methods may further include: the corresponding drain voltages of the bottom FET stage of the cascode amplifier and the cascode reference circuit being approximately the same; the cascode reference circuit being a split cascode reference circuit; providing an input impedance matching network coupled to the input of the bottom FET stage and configured to be coupled to the RF input signal to be amplified; providing an output impedance matching network coupled to the output; providing a respective decoupling network coupled between corresponding gates of each of the bottom two FET stages of the cascode amplifier; at least one decoupling network including a programmable resistance element for varying bias levels to the coupled gates; coupling a degeneration inductor between the source of the bottom FET stage of the cascode amplifier and RF ground, the degeneration inductor having a resistance Rdeg, and coupling a compensation resistor between the source of the bottom FET stage of the cascode reference circuit and RF ground, the compensation resistor having a resistance Rcomp such that the voltage at the source of the bottom FET stage of the cascode reference circuit closely approximates the voltage at the source of the bottom FET stage of the cascode amplifier; the input to the bottom FET stage being coupled to the gate of the bottom FET stage; the input to the bottom FET stage being coupled to the source of the bottom FET stage; coupling a source voltage to the cascode amplifier and the cascode reference circuit, the source voltage having a range of about 0.4V to about 4.5V; coupling a bias voltage to the gates of the cascode amplifier, the bias voltage having a range of about 0.4V to about 4.5V; the RF input signal including frequencies from and above about 100 MHz; and fabricating the FETs in the cascode amplifier and in the cascode reference circuit with gate lengths less than about 1 µm.

Fabrication Technologies and Options

The term "MOSFET" technically refers to metal-oxide-semiconductors; another synonym for MOSFET is "MIS- FET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation. Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarding as starting a conflicting labeling sequence).

What is claimed is:

1. An amplifier circuit including:
   (a) a cascode amplifier having at least two serially connected field effect transistor (FET) stages, each FET stage having a gate, a drain, and a source, the bottom FET stage having an input configured to be coupled to an RF input signal to be amplified, and the top FET stage of the cascode amplifier having an output for providing an amplified RF input signal;
   (b) a cascode reference circuit having at least two serially connected FET stages, each FET having a gate, a drain, and a source, the gates of the bottom two FET stages of the cascode reference circuit being coupled to the corresponding gates of the bottom two FET stages of the cascode amplifier, for biasing the cascode amplifier to output a final current approximately equal to a multiple of a mirror current in the cascode reference circuit; and
   (c) an op-amp having a first and a second input and an output, the first input being coupled between a voltage source through a first resistor and a reference current source, the second input being coupled between the voltage source through a second resistor and the drain of the top FET stage of the cascode reference circuit, the output being coupled to the respective gates of the bottom FET stages of the cascode reference circuit and the cascode amplifier, wherein the op-amp is responsive to differences between its first and second inputs and outputs an adjustment gate bias voltage applied to the respective gates of the bottom FET stage of the cascode amplifier and of the cascode reference circuit that forces the mirror current in the cascode reference circuit to be approximately equal to a selected current value.

2. An amplifier circuit including:
   (a) a cascode amplifier having at least two serially connected field effect transistor (FET) stages, each FET stage having a gate, a drain, and a source, the bottom FET stage having an input configured to be coupled to an RF input signal to be amplified, and the top FET stage of the cascode amplifier having an output for providing an amplified RF input signal;
   (b) a cascode reference circuit having at least two serially connected FET stages, each FET having a gate, a drain, and a source, the gates of the bottom two FET stages of the cascode reference circuit being coupled to the corresponding gates of the bottom two FET stages of the cascode amplifier, for biasing the cascode amplifier to output a final current approximately equal to a multiple of a mirror current in the cascode reference circuit; and
   (c) an op-amp having a first and a second input and an output, the first input being coupled between a reference current source and a resistor coupled to circuit ground, the second input being coupled between a mirror current source and the drain of the top FET stage of the cascode reference circuit, the output being coupled to the respective gates of the bottom FET stages of the cascode reference circuit and the cascode amplifier, wherein the op-amp is responsive to differences between its first and second inputs and outputs an adjustment gate bias voltage applied to the respective gates of the bottom FET stage of the cascode amplifier and of the cascode reference circuit that forces the mirror current in the cascode reference circuit to be approximately equal to a selected current value.

3. An amplifier circuit including:
(a) a cascode amplifier having at least two serially connected field effect transistor (FET) stages, each FET stage having a gate, a drain, and a source, the bottom FET stage having an input configured to be coupled to an RF input signal to be amplified, and the top FET stage of the cascode amplifier having an output for providing an amplified RF input signal;
(b) a split cascode reference circuit having at least two FET stages, each FET having a gate, a drain, and a source, the gates of the bottom two FET stages of the cascode reference circuit being coupled to the corresponding gates of the bottom two FET stages of the cascode amplifier, for biasing the cascode amplifier to output a final current approximately equal to a multiple of a mirror current in the cascode reference circuit, the drain of the bottom FET stage of the cascode reference circuit being coupled to a first mirror current source and the source of the bottom FET stage of the cascode reference circuit being coupled to circuit ground, and the drain of the next-to-bottom FET stage of the cascode reference circuit being coupled to a voltage source and the source of the next-to-bottom FET stage of the cascode reference circuit being coupled to a second mirror current source; and
(c) an op-amp having a first and a second input and an output, the first input being coupled to the source of the next-to-bottom FET stage of the cascode reference circuit, the second input being coupled to the drain of the bottom FET stage of the cascode reference circuit, the output being coupled to the respective gates of the bottom FET stages of the cascode reference circuit and the cascode amplifier, wherein the op-amp is responsive to differences between its first and second inputs and outputs an adjustment gate bias voltage applied to the respective gates of the bottom FET stage of the cascode amplifier and of the cascode reference circuit that forces the mirror current in the cascode reference circuit to be approximately equal to a selected current value.

4. The invention of claim 3, further including a buffer circuit between the output of the op-amp and the coupled respective gates of the bottom FET stages of the cascode reference circuit and the cascode amplifier.

5. The invention of claim 4, wherein the buffer circuit is configured as a source follower buffer circuit.

6. The invention of claim 1, wherein the corresponding drain voltages of the bottom FET stage of the cascode amplifier and the cascode reference circuit are approximately the same.

7. The invention of claim 2, wherein the corresponding drain voltages of the bottom FET stage of the cascode amplifier and the cascode reference circuit are approximately the same.

8. The invention of claim 3, wherein the corresponding drain voltages of the bottom FET stage of the cascode amplifier and the cascode reference circuit are approximately the same.

9. The invention of claim 1, further including an input impedance matching network coupled to the input of the bottom FET stage and configured to be coupled to the RF input signal to be amplified.

10. The invention of claim 2, further including an input impedance matching network coupled to the input of the bottom FET stage and configured to be coupled to the RF input signal to be amplified.

11. The invention of claim 3, further including an input impedance matching network coupled to the input of the bottom FET stage and configured to be coupled to the RF input signal to be amplified.

12. The invention of claim 1, further including an output impedance matching network coupled to the output.

13. The invention of claim 2, further including an output impedance matching network coupled to the output.

14. The invention of claim 3, further including an output impedance matching network coupled to the output.

15. The invention of claim 1, further including a respective decoupling network coupled between corresponding gates of each of the bottom two FET stages of the cascode amplifier, wherein at least one decoupling network includes a programmable resistance element for varying bias levels to the coupled gates.

16. The invention of claim 2, further including a respective decoupling network coupled between corresponding gates of each of the bottom two FET stages of the cascode amplifier, wherein at least one decoupling network includes a programmable resistance element for varying bias levels to the coupled gates.

17. The invention of claim 3, further including a respective decoupling network coupled between corresponding gates of each of the bottom two FET stages of the cascode amplifier, wherein at least one decoupling network includes a programmable resistance element for varying bias levels to the coupled gates.

18. The invention of claim 1, further including:
(a) a degeneration inductor coupled between the source of the bottom FET stage of the cascode amplifier and RF ground, the degeneration inductor having a resistance Rdeg; and
(b) a compensation resistor coupled between the source of the bottom FET stage of the cascode reference circuit and RF ground, the compensation resistor having a resistance Rcomp such that the voltage at the source of the bottom FET stage of the cascode reference circuit closely approximates the voltage at the source of the bottom FET stage of the cascode amplifier.

19. The invention of claim 2, further including:
(a) a degeneration inductor coupled between the source of the bottom FET stage of the cascode amplifier and RF ground, the degeneration inductor having a resistance Rdeg; and
(b) a compensation resistor coupled between the source of the bottom FET stage of the cascode reference circuit and RF ground, the compensation resistor having a resistance Rcomp such that the voltage at the source of the bottom FET stage of the cascode reference circuit closely approximates the voltage at the source of the bottom FET stage of the cascode amplifier.

20. The invention of claim 3, further including:
(a) a degeneration inductor coupled between the source of the bottom FET stage of the cascode amplifier and RF ground, the degeneration inductor having a resistance Rdeg; and
(b) a compensation resistor coupled between the source of the bottom FET stage of the cascode reference circuit and RF ground, the compensation resistor having a resistance Rcomp such that the voltage at the source of the bottom FET stage of the cascode reference circuit closely approximates the voltage at the source of the bottom FET stage of the cascode amplifier.

\* \* \* \* \*